US006215144B1

(12) United States Patent
Saito et al.

(10) Patent No.: US 6,215,144 B1
(45) Date of Patent: Apr. 10, 2001

(54) SEMICONDUCTOR INTEGRATED CIRCUIT DEVICE, AND METHOD OF MANUFACTURING THE SAME

(75) Inventors: Masayoshi Saito, Hachiouji; Yoshitaka Nakamura, Ome; Hidekazu Goto, Fussa; Keizo Kawakita; Satoru Yamada, both of Ome; Toshihiro Sekiguchi, Hidaka; Isamu Asano, Iruma; Yoshitaka Tadaki, Hanno; Takuya Fukuda, Kodaira; Masayuki Suzuki, Kokubunji; Tsuyoshi Tamaru, Hachiouji; Naoki Fukuda, Ome; Hideo Aoki, Musashimurayama; Masayoshi Hirasawa, Ome, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/236,223

(22) Filed: Jan. 25, 1999

(30) Foreign Application Priority Data

Jan. 26, 1998 (JP) ..................... 10-012614

(51) Int. Cl.[7] ..................... H01L 29/72

(52) U.S. Cl. ..................... 257/310; 257/303; 257/304; 257/305; 257/306

(58) Field of Search ..................... 257/303, 304, 257/305, 306, 310

(56) References Cited

U.S. PATENT DOCUMENTS 5,383,088 * 1/1995 Chapple-Sokol et al. ........... 257/310

FOREIGN PATENT DOCUMENTS 1-222469 9/1989 (JP) .
6-29240 2/1994 (JP) .
8-181212 7/1996 (JP) .
9-92794 4/1997 (JP) .

* cited by examiner

*Primary Examiner*—Edward Wojciechowicz
(74) *Attorney, Agent, or Firm*—Antonelli, Terry, Stout & Kraus, LLP

(57) ABSTRACT

In a DRAM having a capacitor-over-bitline structure in which the capacitive insulating film of an information storing capacitive element C is formed of a high dielectric material such as $Ta_2O_5$ (tantalum oxide) film 46, the portions of bit lines BL and first-layer interconnect lines 23 to 26 of a peripheral circuit which are in contact with at least an underlying silicon oxide film 28 are formed of a W film, the bit lines BL and the interconnect lines 23 to 26 being arranged below the information storing capacitive element C, whereby the adhesion at the interface between the bit lines BL and the interconnect lines 23 to 26 and the silicon oxide film is improved in terms of high-temperature heat treatment to be performed when the capacitive insulating film is being formed.

19 Claims, 34 Drawing Sheets

BL
45
WL(8A)
21
48
22
L
B'
B
A
A'
X
Y 27
17
18
16
13
12
13s
Qp
Qn
Qs
20
19
WL
8A
8B
8C
9a
1
2
3
4
5
6
7
10
11
14
15

28
17
18
16
12
13s
13
21
1
4
8C
11
15
Qp
7
6
2
10
8B
Qn
14
5
3
WL
20
9
Qs
8A
19

34
13s
8C
4
1
33
11
15
12
Qp
7
32
17
18
6
2
31
28
10
8B
Qn
14
30
16
5
13
3
WL
21
20
9
Qs
8A
19
22

35
34
13s
33
12
15
Qp
8C
32
31
16
17
18
28
Qn
14
10
8B
37
30
13
5
6
2
3
WL
20
21
9
Qs
7
8A
19
22
11
4
1

SEMICONDUCTOR INTEGRATED CIRCUIT DEVICE, AND METHOD OF MANUFACTURING THE SAME

BACKGROUND OF THE INVENTION

The present invention relates to a semiconductor integrated circuit device and the art of manufacturing the same; and, more specifically, the invention relates to improvements applicable to a semiconductor integrated circuit device having a DRAM (Dynamic Random Access Memory).

The memory cells of a DRAM are arranged at the cross points of a plurality of word lines and a plurality of bit lines all, of which are arranged in the form of a matrix over the principal surface of a semiconductor substrate, and each of the memory cells includes one memory cell selecting MISFET and one information storing capacitive element (capacitor) which is connected in series with the memory cell selecting MISFET. The memory cell selecting MISFET mainly includes a gate oxide film, a gate electrode formed integrally with a word line, and a pair of semiconductor regions which constitute a source and a drain. The bit line is arranged above the memory cell selecting MISFET, and is electrically connected to either one of the source and the drain. The information storing capacitive element is similarly arranged above the memory cell selecting MISFET, and is electrically connected to the other of the source and the drain.

As is known, recent types of DRAMs have adopted a so-called stacked capacitor structure in which information storing capacitive elements are arranged above memory cell selecting MISFETs to compensate for a decrease in the charge storage quantity per information storing capacitive element due to the scaling of memory cells. DRAMs which adopt this stacked capacitor structure are divided into two kinds, a capacitor under bitline (CUB) structure in which information storing capacitive elements are arranged below bit lines and a capacitor over bitline (COB) structure in which information storing capacitive elements are arranged above bit lines.

In the above-described two kinds of stacked capacitor structures, as compared with the CUB structure, the COB structure in which information storing capacitive elements are arranged above bit lines is suited to the scaling of memory cells. This is because, if the charge storage quantity of a scaled information storing capacitive element is to be increased, it is necessary to three-dimensionally design the structure of the information storing capacitive element and increase the surface area thereof, but in the case of the CUB structure in which bit lines are arranged above information storing capacitive elements, contact holes for connecting the bit lines and the memory cell selecting MISFETs become extremely large in aspect ratio and the contact holes become difficult to open.

In the case of recent large-capacity DRAMs such as 64- or 256-Mbit DRAMs, it has become difficult to ensure the required charge storage quantity merely by three-dimensionally forming information storing capacitive elements and increasing the surface areas thereof, and in addition to the three-dimensional formation of the capacitive elements, consideration has been given to the use of a capacitive insulating film formed of a high dielectric material such as $Ta_2O_5$ (tantalum oxide), (Ba, Sr)$TiO_3$ (barium strontium titanate; hereinafter referred to as BST) or $SrTiO_3$ (strontium titanate; hereinafter referred to as STO). DRAMs using a capacitive insulating film formed of such a high dielectric material are described in, for example, Japanese Patent Laid-Open No. 222469/1989 and U.S. Pat. No. 5,383,088.

Furthermore, in the field of the above-noted 64-to-256-Mbit DRAMs, it has been considered inevitable to use a metal material which is lower in resistance than a polycrystalline silicon film, for the material of word lines and bit lines as a countermeasure for signal delay due to an increase in chip size, or to use the silicidation technique of forming a high melting-point metal silicide layer such as $TiSi_2$ (titanium silicide) or $CoSi_2$ (cobalt silicide) over the surfaces of the sources and drains of MISFETs which constitute peripheral circuits, such as sense amplifiers and word drivers, which are required to perform high-speed operation, as a countermeasure for avoiding an increase in resistance due to the scaling of contact holes for connecting interconnect lines and the sources and drains of the MISFETs. This silicidation technique is described in, for example, Japanese Patent Laid-Open Nos. 29240/1994 and 181212/1996.

SUMMARY OF THE INVENTION

In DRAMs which belong to a 256-Mbit or later generation, as a countermeasure for signal delay due to an increase in chip size, the gate electrodes (word lines) of memory cell selecting MISFETs and the gate electrodes of MISFETs of peripheral circuits are formed of a low-resistance material mainly made of a high melting-point metal such as W (tungsten), and as a countermeasure for decreasing the contact resistance between diffusion layers and interconnect lines, a high melting-point silicide layer is formed over the surfaces of the sources and drains of the MISFETs which constitute the peripheral circuits.

In such DRAMs, as a countermeasure for the signal delay of bit lines, the bit lines are formed of a low-resistance material mainly made of a high melting-point metal such as W, and as a countermeasure for reducing the number of process steps for forming the interconnect lines, the bit lines and first-layer interconnect lines of the peripheral circuits are formed at the same time in one process step. Moreover, in the DRAMs, as a countermeasure for ensuring the charge storage quantities of the information storing capacitive elements, a COB structure in which information storing capacitive elements are arranged above a bit line is adopted to facilitate the three-dimensional formation of the capacitive elements, and capacitive insulating films are formed of a high dielectric material such as $Ta_2O_5$ (tantalum oxide).

However, the present inventor has examined the above-described DRAM manufacturing process and has discussed a phenomenon in which the bit lines formed above the MISFETs and the first-layer interconnect lines of the peripheral circuits have peeled off the surfaces of the insulating films during high-temperature heat treatment which was performed in a subsequent process step for forming the information storing capacitive elements.

The outline of a process for manufacturing the above-described type of DRAM will be described in brief below. First of all, a low-resistance material which is mainly made of a high melting-point metal deposited over a principal surface of a semiconductor substrate is patterned to form gate electrodes (word lines) of memory cell selecting MISFETs and gate electrodes of MISFETs of a peripheral circuit, and then an impurity is ion-implanted into the semiconductor substrate to form the sources and drains of these MISFETs.

Then, after these MISFETs are covered with an insulating film, contact holes are formed in the insulating film above the respective sources and drains of the memory cell selecting MISFETs, and polycrystalline silicon plugs are buried into the respective contact holes. Then, after contact holes are formed in the insulating film above the respective gate electrodes, sources and drains of the MISFETs of the peripheral circuit, a high melting-point metal film such as a Ti film or a Co film is thinly deposited over the insulating film as well as the interiors of these contact holes. Then, the semiconductor substrate is heat-treated to cause the substrate (Si) and the high melting-point metal to react with each other at the bottoms of the contact holes, thereby forming a high melting-point metal silicide layer at the bottoms of the contact holes.

Then, after an interconnect-line material which mainly contains a high melting-point metal such as W is deposited over the insulating film as well as the interiors of the contact holes of the peripheral circuit, the interconnect-line material and an unreacted Ti film remaining on the surface of the insulating film are patterned to form bit lines and first-layer interconnect lines of the peripheral circuit over the insulating film. The bit lines are electrically connected to either the sources or the drains of the memory cell selecting MISFETs through the contact holes in which the polycrystalline silicon plugs are buried. The first-layer interconnect lines of the peripheral circuit are electrically connected to any of the gate electrodes, sources and drains of the MISFETs of the peripheral circuit through the contact holes of the peripheral circuit.

Then, the bit lines and the first-layer interconnect lines of the peripheral circuit are covered with an interlayer insulating film, and through holes for connecting the sources or the drains of the memory cell selecting MISFETs and information storing capacitive elements are formed in the interlayer insulating film. After that, a conducting film such as polycrystalline silicon which is deposited above the through-holes is patterned to form lower electrodes for the information storing capacitive elements each having a three-dimensional structure.

Then, after a high dielectric material such as $Ta_2O_5$ (tantalum oxide) is deposited over the surfaces of the lower electrodes, high-temperature heat treatment is performed. Any high dielectric material made of a metal oxide such as $Ta_2O_5$, BST or STO has a common nature which needs high-temperature heat treatment of approximately 800° C. after film formation in order to reduce leakage current. In addition, it is necessary to take care not to expose the degradation of the film quality to a high temperature of not less than approximately 450° C., after such high-temperature heat treatment is performed.

Then, after a conducting film such as a TiN film is deposited over the high dielectric film, this conducting film and the underlying high dielectric material are patterned to form upper electrodes of the information storing capacitive elements and a capacitive insulating film.

However, the present inventor has examined the above-described DRAM manufacturing process and has discovered a phenomenon in which the bit lines and the first-layer interconnect lines of the peripheral circuit have peeled off the surface of the insulating film during the high-temperature heat treatment for improving the film quality of the $Ta_2O_5$ film. This is because, if the Ti film used to form the Ti silicide layer at the bottoms of the contact holes remains on the insulating film formed of silicon oxide, peeling occurs at the interface between the Ti film and silicon oxide, and the reason for this is considered to be that Ti easily forms an oxide compared to Si.

As a countermeasure for preventing the peeling of the Ti film and the silicon oxide film due to high-temperature heat treatment, there is a method using an acid etchant to remove an unreacted Ti film which remains on the surface of the insulating film after the Ti film is heat-treated to form the Ti silicide layer at the bottoms of the contact holes. However, in the process step of forming the contact holes in the insulating film above the sources and drains of the MISFETs of the peripheral circuit, since contact holes are also formed above the gate electrodes of the MISFETs at the same time, if the unreacted Ti film is removed by the etchant after the formation of the Ti silicide film, the etchant also enters the contact holes formed above the gate electrodes and the metal film which constitutes the gate electrodes is etched. Accordingly, the above-described countermeasure is useful in a case where the gate electrodes are formed of a polycrystalline silicon film or a polycide film (a stacked layer made of polycrystalline silicon and high melting-point metal silicide) which has resistance to acid etchants, but cannot be applied to a case where the gate electrodes are formed of a material which mainly contains metal.

As a countermeasure for preventing peeling from occurring at the interface between the Ti film and the silicon oxide film, there is a method of replacing the Ti film with a TiN (titanium nitride) film having good adhesion to the silicon oxide film by performing heat treatment in a nitrogen atmosphere after a Ti silicide layer is formed by heat-treating the Ti film (or while the Ti silicide is being formed). However, it is difficult to completely replace the Ti film on the silicon oxide film with the TiN film by heat treatment in a nitrogen atmosphere, so that although the surface of the film may be nitrified, the interface between the film and the silicon oxide film is not completely nitrified. In addition, if this high-temperature heat treatment is continued for a long time, the diffusion of impurities implanted in the sources and drains of the MISFETs is promoted to hinder formation of shallow junctions.

An object of the present invention is to provide a way art of preventing a failure in which an underlying interconnect line peels off the surface of an insulating film during high-temperature heat treatment to be performed for improving the film quality of a high dielectric material in a DRAM in which the capacitive insulating film of an information storing capacitive element is formed of the high dielectric material.

The above and other objects and novel features of the present invention will become apparent from the following description taken in conjunction with the accompanying drawings.

Representative aspects of the invention disclosed herein will be described below in brief.

(1) In a semiconductor integrated circuit device according to the present invention, an interconnect line which extends with at least a portion of the interconnect line that is in contact with a silicon oxide-based first insulating film is formed over the first insulating film which is formed over a principal surface of a semiconductor substrate, and a capacitive element having a capacitive insulating film at least a portion of which is formed of a high dielectric film is formed over a second insulating film formed over the interconnect line, and a portion of a conducting film which constitutes the interconnect line, which portion is in contact with the first insulating film over the first insulating film, is formed of a high melting-point metal excluding titanium or a nitride of a high melting-point metal.

(2) A semiconductor integrated circuit device according to the present invention, comprises a DRAM in which a memory cell selecting MISFET provided with a gate electrode formed integrally with a word line is formed in a first area over a principal surface of a semiconductor substrate, a bit line is formed over a silicon oxide-based first insulating film which covers the memory cell selecting MISFET, the bit line being electrically connected to either one of a source and a drain of the memory cell selecting MISFET and extending in contact with the first insulating film, and an information storing capacitive element is formed over a second insulating film that is formed over the bit line, the information storing capacitive element being electrically connected to the other of the source and drain of the memory cell selecting MISFET and having a capacitive insulating film at least a portion of which is formed of a high dielectric film, wherein a portion of a conducting film which constitutes the bit line, which portion is in contact with the first insulating film over the first insulating film, is formed of a high melting-point metal excluding titanium or a nitride of a high melting-point metal.

(3) In the semiconductor integrated circuit device according to the present invention as described in the above paragraph (2), the high dielectric film is a tantalum oxide film which is subjected to heat treatment for crystallization.

(4) In the semiconductor integrated circuit device according to the present invention as described in the above paragraph (2), a conducting film which constitutes a gate electrode of the memory cell selecting MISFET is at least partly formed of a metal film.

(5) In the semiconductor integrated circuit device according to the present invention as described in the above paragraph (2), a MISFET of a peripheral circuit of the DRAM is formed in a second area over the principal area of the semiconductor substrate, a first-layer interconnect line is formed over the silicon oxide-based first insulating film which covers the MISFET of the peripheral circuit, the first-layer interconnect line being electrically connected to any one of a gate electrode, a source and a drain of the MISFET of the peripheral circuit and extending in contact with the first insulating film, and a portion of a conducting film which constitutes the first-layer interconnect line, which portion is in contact with the first insulating film over the first insulating film, is formed of a high melting-point metal excluding titanium or a nitride of a high melting-point metal.

(6) In a semiconductor integrated circuit device according to the present invention as described in the above paragraph (5), a titanium silicide layer is formed at a bottom of a contact hole which is opened in the first insulating film and electrically connects the first-layer interconnect line and the source or drain of the MISFET of the peripheral circuit.

(7) In a semiconductor integrated circuit device according to the present invention as described in the above paragraph (5), each of the conducting films which respectively constitute the bit line and the first-layer interconnect line is a tungsten film.

(8) In a semiconductor integrated circuit device according to the present invention as described in the above paragraph (5), the first-layer interconnect line is electrically connected to the source or drain of the MISFET of the peripheral circuit via a plug which is formed in the contact hole and is formed of a stacked film made of a titanium film and a barrier metal film or a stacked film made of a titanium film, a barrier metal film and a tungsten film.

(9) In a semiconductor integrated circuit device according to the present invention as described in the above paragraph (5), the gate electrode of the MISFET of the peripheral circuit is formed of a metal film.

(10) In a semiconductor integrated circuit device according to the present invention as described in the above paragraph (5), the first insulating film is a spin-on-glass film or a silicon oxide film deposited by a CVD method.

(11) In a semiconductor integrated circuit device according to the present invention as described in the above paragraph (5), a second-layer interconnect line which is electrically connected to the first insulating film is formed over a silicon oxide-based third insulating film formed over the information storing capacitive element, and a portion of a conducting film which constitutes the second-layer interconnect line is a titanium film, the portion being in contact with the first insulating film

(12) A method of manufacturing a semiconductor integrated circuit device, comprises the steps:

(a) forming a silicon oxide-based first insulating film over a principal surface of a semiconductor substrate and then depositing a conducting film, a portion of which is in contact with the first insulating film, over the first insulating film, the portion being made of a high melting-point metal excluding titanium or a nitride of a high melting-point metal including titanium;

(b) patterning the conducting film to form an interconnect line which extends with at least a portion of the interconnect line that is in contact with the first insulating film, and then forming a second insulating film over the interconnect line; and (c) forming a capacitive element made of a first electrode, a dielectric film and a second electrode, over the second insulating film, the capacitive-element forming step including heat treatment for improving the film quality of the dielectric film.

(13) A method of manufacturing a semiconductor integrated circuit device, comprises the step of:

(a) forming a memory cell selecting MISFET which constitutes a memory cell of a DRAM, in a first area over a principal surface of a semiconductor substrate, and forming a MISFET which constitutes a peripheral circuit of the DRAM, in a second area over the principal surface of the semiconductor substrate;

(b) forming a silicon oxide-based first insulating film over each of the memory cell selecting MISFET and the MISFET of the peripheral circuit;

(c) forming a first contact hole in the first insulating film over at least one of a source and a drain of the memory cell selecting MISFET, forming second contact holes in the first insulating film over the respective source and drain of the MISFET of the peripheral circuit, and forming a third contact hole in the first insulating film over a gate electrode of the MISFET of the peripheral circuit;

(d) depositing a titanium film over the first insulating film as on the well as interiors of the respective second and third contact holes, and forming titanium silicide layers over surfaces of a source and a drain of the MISFET of the peripheral circuit which are respectively exposed at the bottoms of the second contact holes, by heat-treating the semiconductor substrate;

(e) depositing a barrier metal film or a stacked film made of the barrier metal and a high melting-point metal film excluding titanium over the titanium film as on the well as interiors of the second and third contact holes and then forming plugs in the respective second and third contact holes by removing the barrier metal film or the stacked film over the first insulating film together with the titanium film;

(f) depositing a conducting film over the first insulating film, at least a portion of the conducting film which is in contact with the first insulating film being made of a high melting-point metal excluding titanium or a nitride of a high melting-point metal;

(g) patterning the conducting film to form a bit line to be electrically connected to one of the source and the drain of the memory cell selecting MISFET through the first contact hole, and forming a first-layer interconnect line of the peripheral circuit to be electrically connected to the MISFET of the peripheral circuit through the second contact holes or the third contact holes; and (h) forming an information storing capacitive element made of a first electrode, a high dielectric film and a second electrode, over the second insulating film, the capacitive-element forming step including heat treatment for improving the film quality of the dielectric film.

(14) In a method of manufacturing a semiconductor integrated circuit device according to the present invention as described in the above paragraph (13), a conducting film which constitutes a gate electrode of the memory cell selecting MISFET and a gate electrode of the MISFET of the peripheral circuit is a stacked film made of a low-resistance polycrystalline silicon film doped with an impurity, a barrier metal film and a tungsten film.

(15) In a method of manufacturing a semiconductor integrated circuit device according to the present invention as described in the above paragraph (13), the bit line and the first-layer interconnect line of the peripheral circuit are made of a tungsten film.

(16) In a method of manufacturing a semiconductor integrated circuit device according to the present invention as described in the above paragraph (13), the dielectric film is made of a metal oxide.

(17) In a method of manufacturing a semiconductor integrated circuit device according to the present invention as described in the above paragraph (16), the metal oxide is tantalum oxide.

(18) In a method of manufacturing a semiconductor integrated circuit device according to the present invention as described in the above paragraph (13), the heat treatment temperature for improving the film quality of the dielectric film is 750° C. or more.

(19) A method of manufacturing a semiconductor integrated circuit device, comprises the steps of:

(a) forming a memory cell selecting MISFET which constitutes a memory cell of a DRAM, in a first area over a principal surface of a semiconductor substrate, and forming a MISFET which constitutes a peripheral circuit of the DRAM, in a second area over the principal surface of the semiconductor substrate;

(b) forming a silicon oxide-based first insulating film over each of the memory cell selecting MISFET and the MISFET of the peripheral circuit;

(c) forming a first contact hole in the first insulating film over at least one of a source and a drain of the memory cell selecting MISFET, forming second contact holes in the first insulating film over the respective source and drain of the MISFET of the peripheral circuit, and forming a third contact hole in the first insulating film over a gate electrode of the MISFET of the peripheral circuit;

(d) depositing a cobalt film over the first insulating film as well as on the interiors of the respective second and third contact holes, and forming cobalt silicide layers over surfaces of a source and a drain of the MISFET of the peripheral circuit which are respectively exposed at bottoms of the second contact holes, by heat-treating the semiconductor substrate;

(e) depositing a barrier metal film or a stacked film made of the barrier metal and a high melting-point metal film excluding cobalt over the cobalt film as well as on the interiors of the second and third contact holes and then forming plugs in the respective second and third contact holes by removing the barrier metal film or the stacked film over the first insulating film together with the cobalt film;

(f) depositing a conducting film over the first insulating film, at least a portion of the conducting film which is in contact with the first insulating film being made of a high melting-point metal excluding cobalt or a nitride of a high melting-point metal;

(g) patterning the conducting film to form a bit line to be electrically connected to one of the source and the drain of the memory cell selecting MISFET through the first contact hole, and forming a first-layer interconnect line of the peripheral circuit to be electrically connected to the MISFET of the peripheral circuit through the second contact holes or the third contact holes; and (h) forming an information storing capacitive element made of a first electrode, a high dielectric film and a second electrode, over the second insulating film, the capacitive-element forming step including heat treatment for improving the film quality of the dielectric film.

DESCRIPTION OF THE PREFERRED EMBODIMENT

Figure 1:
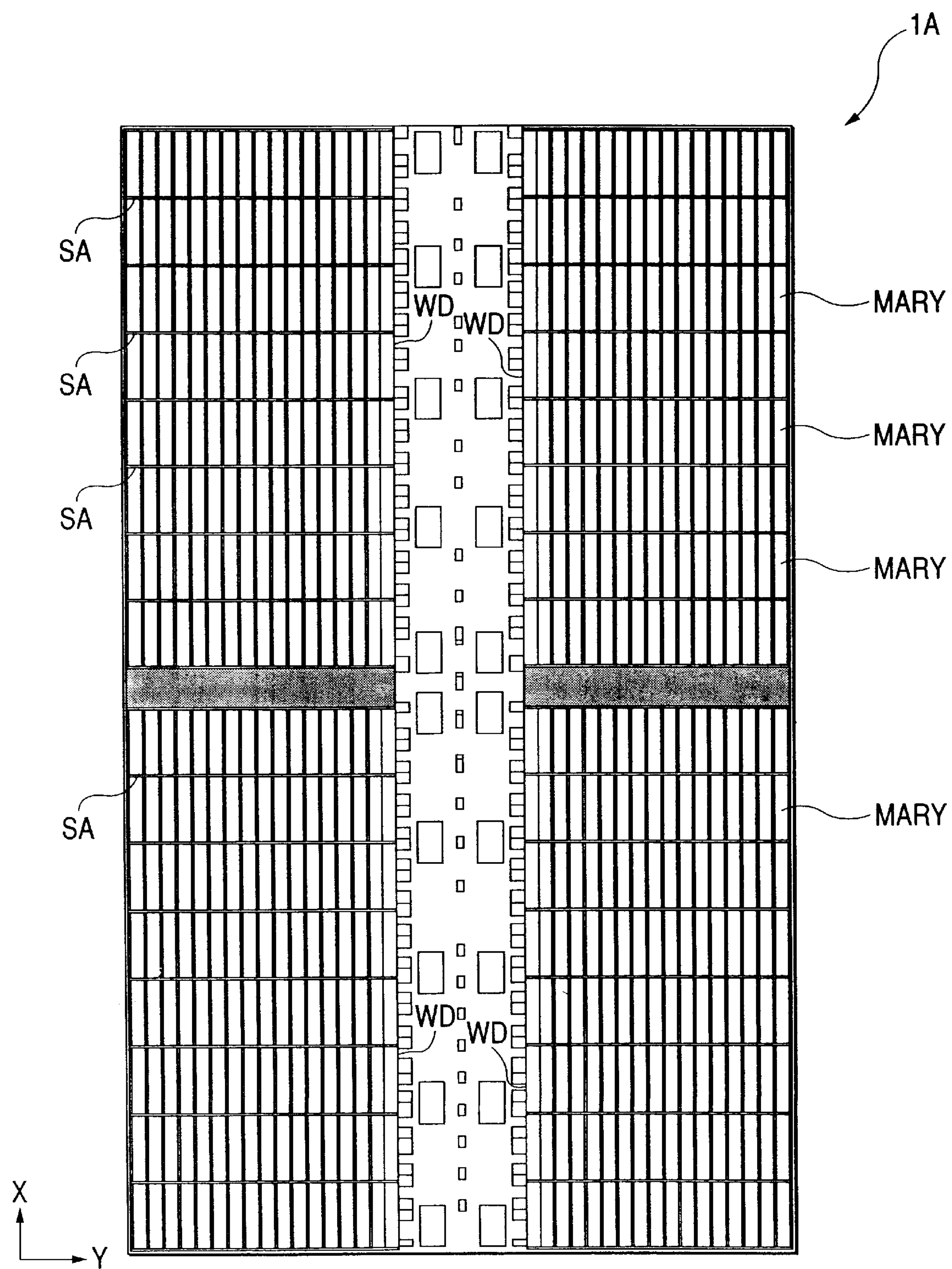
FIG. 1 is a plan view of an entire semiconductor chip over which a DRAM according to one embodiment of the present invention is formed.

A preferred embodiment of the present invention will be described below in detail with reference to the accompanying drawings. Throughout all the drawings that illustrate the preferred embodiment, identical reference numerals are used to denote constituent elements having identical functions, and repetition of the same description is omitted for the sake of simplicity.

FIG. 1 is a plan view of an entire semiconductor chip over which a DRAM according to the preferred embodiment is formed. As shown, a multiplicity of memory arrays MARY are arranged in the form of a matrix in the X-direction (along the longer sides of a semiconductor chip 1A) and in the Y-direction (along the shorter sides of the semiconductor chip 1A) over a principal surface of the semiconductor chip 1A made of single-crystal silicon. A sense amplifier SA is arranged between each of the memory arrays MARY and adjacent one in the X-direction. Control circuits such as word drivers WD and data line selecting circuits, input/output circuits, bonding pads and the like are arranged in the central portion of the principal surface of the semiconductor chip 1A.

Figure 2:
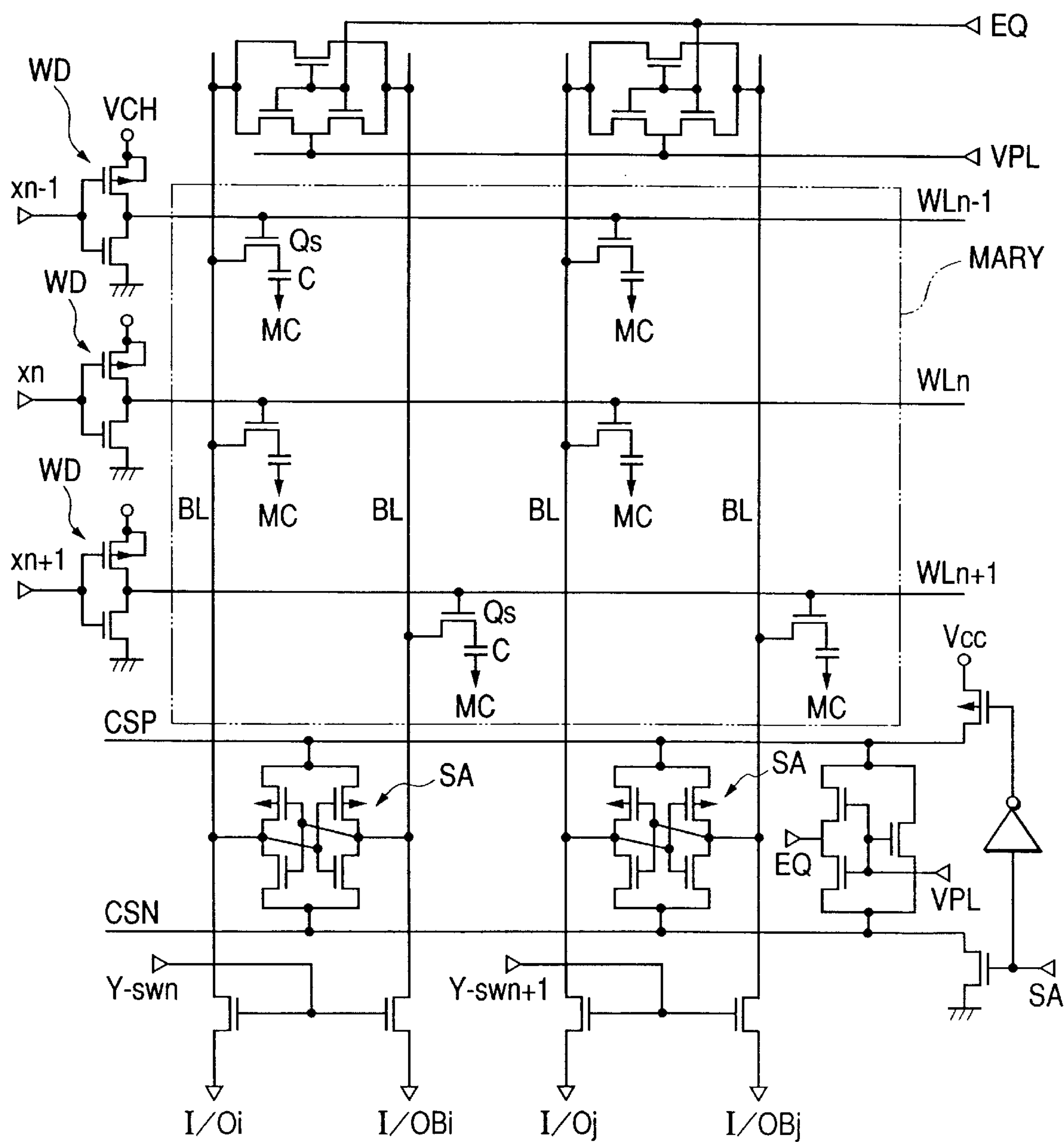
FIG. 2 is a circuit diagram of the equivalent circuit of the DRAM according to the embodiment of the present invention.

FIG. 2 is a circuit diagram of the equivalent circuit of the above-described DRAM. As shown, the memory arrays (MARY) of this DRAM include a plurality of word lines WL (WLn−1, WLn, WLn+1, . . . ) which extend in the row direction, a plurality of bit lines BL which extend in the column direction, and a plurality of memory cells (MC) which are arranged at the cross points of the word lines WL and the bit lines BL. One memory cell for storing one bit of information includes one information storing capacitive element C and one memory cell selecting MISFET Qs which is connected in series with the information storing capacitive element C. Either one of the source and drain of the memory cell selecting MISFET Qs is electrically connected to the information storing capacitive element C, while the other is electrically connected to the corresponding one of the bit lines BL. One end of each of the word lines WL is connected to the corresponding one of the word drivers WD, and one end of each of the bit lines BL is connected to the corresponding one of the sense amplifiers SA.

Figure 3:
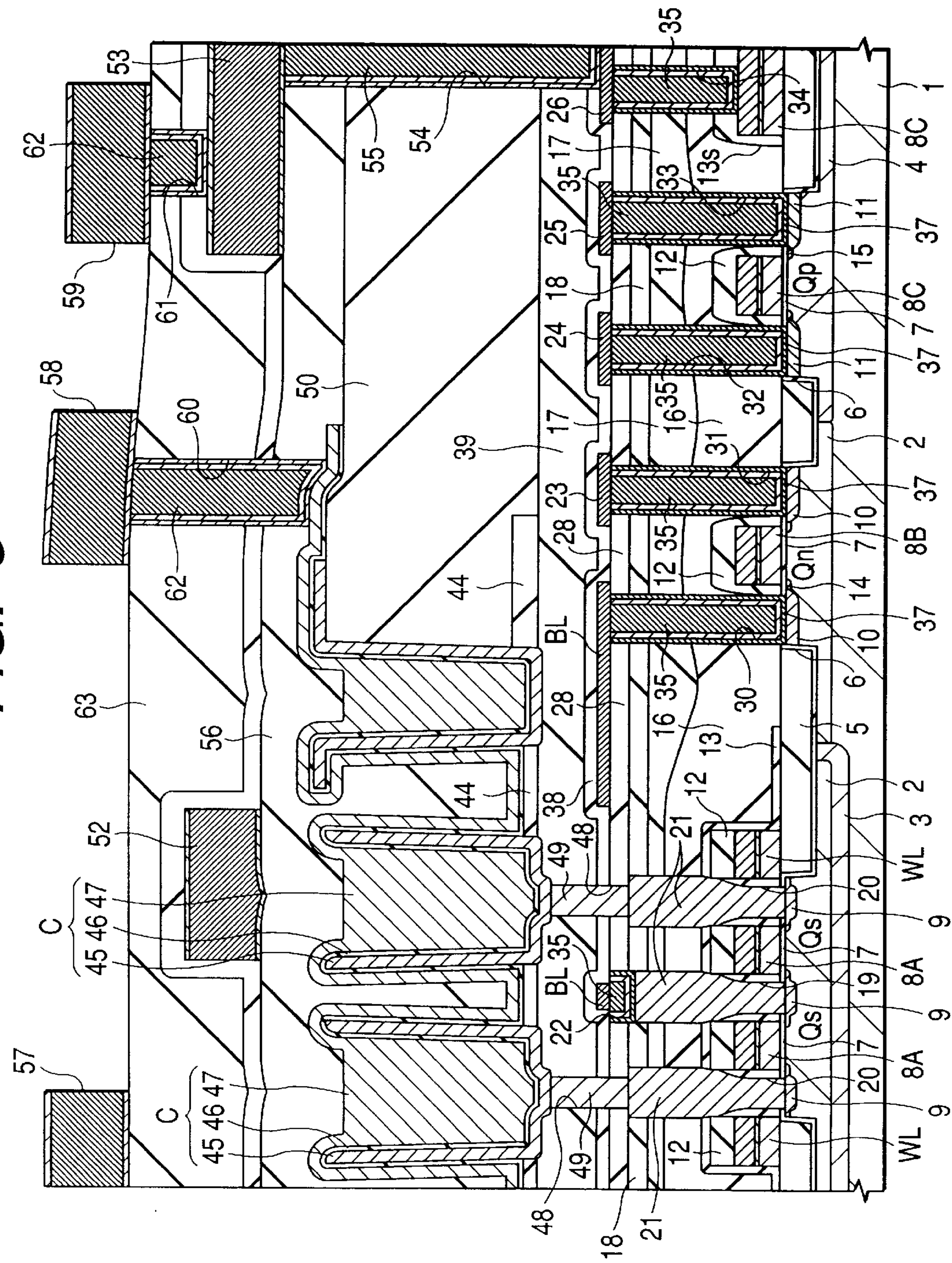
FIG. 3 is a cross-sectional view of a representative portion of a semiconductor substrate, partly showing a memory array and a peripheral circuit of the DRAM according to the embodiment of the present invention.
Figure 4:
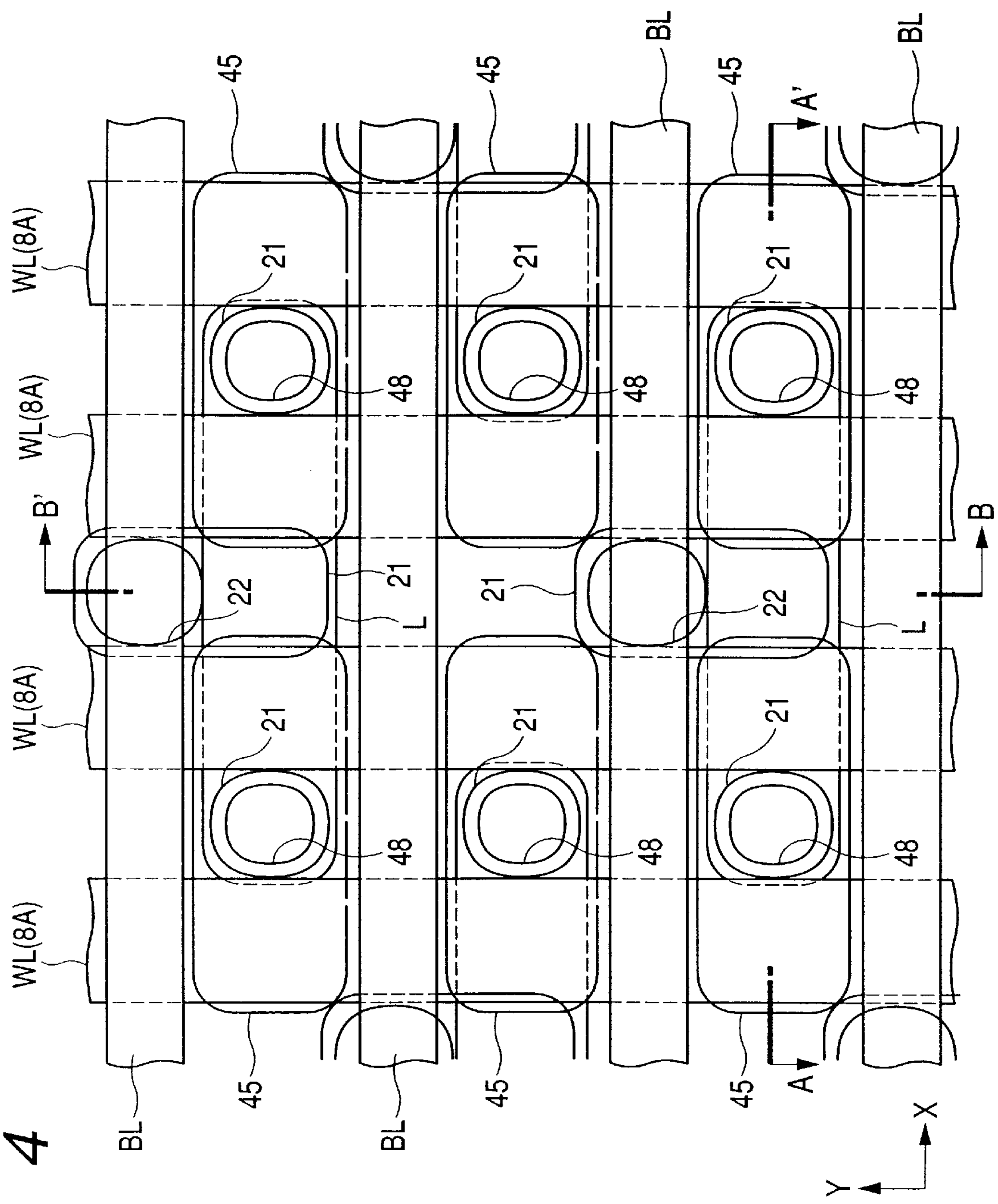
FIG. 4 is a schematic plan view of the semiconductor substrate, partly showing the memory array.

FIG. 3 is a cross-sectional view of an essential portion of a semiconductor substrate, partly showing a memory array and a peripheral circuit of the DRAM, and FIG. 4 is a schematic plan view of the semiconductor substrate, partly showing the memory array. In FIG. 4, only conducting layers (excluding plate electrodes) which constitute memory cells are shown, but the illustration of interconnect lines which are formed above the insulating films between the conducting layers or the memory cells is omitted for clarity.

As shown in FIG. 3, the memory cells of the DRAM are formed in a p-well 2 which is formed in the principal surface of a semiconductor substrate 1 made of p-type single-crystal silicon. In a region (memory array) in which the memory cells are formed, the p-well 2 is electrically isolated from the semiconductor substrate 1 by an n-type semiconductor region 3 which is formed below the p-well 2, so that noise is prevented from entering the p-well 2 from an input/output circuit formed in another region of the semiconductor substrate 1.

Each of the memory cells has a stacked structure in which an information storing capacitive element C is arranged above the memory cell selecting MISFET Qs. The memory cell selecting MISFET Qs has an n-channel type structure, and as shown in FIG. 4, a plurality of memory cell selecting MISFETs Qs are formed in each active region L which is arranged in an elongate island-shaped pattern extending straightforwardly in the X-direction (column direction). In the active region L, two memory cell selecting MISFETs Qs which share either one of a source and a drain (n-type semiconductor regions 9) are formed adjacently to each other in the X-direction.

Isolation regions which surround the active region L are formed by isolation trenches 6 formed in the p-well 2. A silicon oxide film 5 is buried in the isolation trenches 6, and the surface of the silicon oxide film 5 is flattened so as to be approximately equal in height to the surface of the active region L. The isolation region which is formed by such isolation trench 6 has a large effective area compared to an isolation region (field oxide film) formed with the same dimensions by a LOCOS (localized oxidation) process, because no bird's beaks occur at the edges of the active region L.

The memory cell selecting MISFET Qs mainly includes a gate oxide film 7, a gate electrode 8A, and a pair of n-type semiconductor regions 9 which constitute the source and the drain of the memory cell selecting MISFET Qs. The gate electrodes 8A of the respective memory cell selecting MISFETs Qs are formed integrally with the word lines WL, and extend straightforwardly in the Y-direction with the same width and space. The width of each of the gate electrodes 8A, i.e., a gate length, and the space between two adjacent ones of the gate electrodes 8A (the word lines WL) are approximately equal to the minimum process dimensions determined by the resolution limit of photolithography. Each of the gate electrodes 8A (the word lines WL) has a poly-metal structure which includes a low-resistance polycrystalline silicon film doped with an n-type impurity such as P (phosphorous), a barrier metal layer formed of a WN (tungsten nitride) film over the polycrystalline silicon film, and a high melting-point metal film formed of a W (tungsten) film or the like over the barrier metal layer. The gate electrode 8A (the word line WL) having the poly-metal structure is low in electrical resistance compared to a gate electrode formed of a polycrystalline silicon film or a polycide film, so that the signal delay of word lines can be reduced.

The peripheral circuit of the DRAM includes an n-channel type MISFET Qn and a p-channel type MISFET Qp. The n-channel type MISFET Qn is formed in the p-well 2, and mainly includes the gate oxide film 7, a gate electrode 8B, and a pair of $n^+$-type semiconductor regions 10 which constitute the source and the drain of the p-channel type MISFET Qp. The p-channel type MISFET Qp is formed in a p-well 4, and mainly includes the gate oxide film 7, a gate electrode 8C, and a pair of $p^+$-type semiconductor regions 11 which constitute the source and the drain of the p-channel type MISFET Qp. The gate electrodes 8B and 8C have poly-metal structures identical to those of the gate electrodes 8A (the word lines WL). The n-channel type MISFET Qn and the p-channel type MISFET Qp which constitute the peripheral circuit are fabricated according to milder design rules than those for memory cells.

A silicon nitride film 12 is formed above the gate electrodes 8A (the word lines WL) of the memory cell selecting MISFETs Qs, and a silicon nitride film 13 is formed over the top and the sidewalls of the silicon nitride film 12 and over the sidewalls of the gate electrodes 8A (the word lines WL). The silicon nitride film 12 is also formed over the top of each of the gate electrodes 8B and 8C of the peripheral circuit, and sidewall spacers 13*s* formed of the silicon nitride film 13 are formed over the sidewalls of each of the gate electrodes 8B and 8C.

As will be described later, the silicon nitride film 12 and the silicon nitride film 13 of the memory arrays are used as an etching stopper when contact holes are being formed by self-alignment above the sources and drains of the memory cell selecting MISFETs Qs (the n-type semiconductor regions 9). The sidewall spacers 13*s* of the peripheral circuit are used for giving LDD (Lightly Doped Drain) structures to the source and drain of the n-channel type MISFET Qn and to the source and drain of the p-channel type MISFET Qp LDD.

A SOG film 16 is formed over the top of each of the memory cell selecting MISFETs Qs, the n-channel type MISFET Qn and the p-channel type MISFET Qp. Silicon oxide films 17 and 18 which constitute two layers are formed over the SOG film 16, and the surface of the overlying silicon oxide film 18 is flattened so as to be approximately equal in height over the entire area of the semiconductor substrate 1.

Contact holes 19 and 20 are formed to extend through the silicon oxide films 18 and 17 as well as the SOG film 16 above the pair of n-type semiconductor regions 9 which respectively constitute the source and the drain of each of the memory cell selecting MISFETs Qs. Plugs 21 each of which is formed of a low-resistance polycrystalline silicon film doped with an n-type impurity (for example, P (phosphorous)) are buried in the respective contact holes 19 and 20.

The diameter in the X-direction of the bottom of each of the contact holes 19 and 20 is defined by the space between the silicon nitride film 13 on a sidewall of one of two opposed gate electrodes 8A (word lines WL) and the silicon nitride film 13 on the opposite sidewall of the other. In other words, each of the contact holes 19 and 20 is formed by self-alignment with respect to the space between two adjacent gate electrodes 8A (word lines WL).

The diameter in the Y-direction of the contact hole 20 for connection to an information storing capacitive element C is smaller than the dimension of the active region L in the Y-direction. In contrast, the diameter in the Y-direction of the contact hole 19 for connection to the bit line BL (a contact hole above the n-type semiconductor region 9 shared by the two memory cell selecting MISFETs Qs) is larger than the dimension of the active region L in the Y-direction. Specifically, the contact hole 19 is formed in an approximately rectangular plan-view pattern in which its diameter in the Y-direction is larger than its diameter in the X-direction (at its top end), and a portion of the contact hole 19 extends from the active region L into an area above the isolation trench 6. Since the contact hole 19 is formed in such a pattern, it is not necessary to partly increase the width of the bit line BL and extend the bit line BL into an area above the active region L nor to partly extend the active region L in the direction of the bit line BL, when the bit line BL is to be connected to the n-type semiconductor region 9 via the contact hole 19. Accordingly, it is possible to reduce the memory cell size.

A silicon oxide film 28 is formed over the silicon oxide film 18. A through-hole 22 is formed in the silicon oxide film 28 above the contact hole 19, and a plug 35 formed of a conducting film in which a Ti film, a TiN film and a W film are stacked in that order from the bottom layer is buried in the through-hole 22. A $TiSi_2$ (titanium silicide) layer 37, which is produced by the reaction between the Ti film which constitutes part of the plug 35 and a polycrystalline silicon film which constitutes a plug 21, is formed at the interface between the plug 35 and the plug 21 buried in the contact hole 19 below the through-hole 22. The through-hole 22 is arranged above the isolation trench 6 displaced from the active region L.

The bit lines BL are formed over the silicon oxide film 28. The bit lines BL are arranged above the isolation trenches 6 and extend straightforwardly in the X-direction with the same width and space. Such a bit line BL is formed of a W film and is electrically connected to either one of the source and the drain of the memory cell selecting MISFET Qs (the n-type semiconductor region 9 shared by the two memory cell selecting MISFETs Qs) through the through-hole 22 formed in the silicon oxide film 28 and the contact hole 19 formed in the underlying insulating films (the silicon oxide films 28, 18, 17, the SOG film 16 and the gate oxide film 7). The space between each of the bit lines BL and the adjacent one is made as wide as possible so that the parasitic capacitances formed between adjacent bit lines BL can be minimized.

By widening the spaces between the bit lines BL and reducing the parasitic capacitances, even if the memory cell size is scaled, it is possible to increase the signal voltage required to read the charge (information) stored in the information storing capacitive elements C. In addition, by widening the spaces between the bit lines BL, it is possible to sufficiently ensure the aperture margin of through-holes 48 (to be described later) which are formed in the areas between the bit lines BL (through-holes for interconnecting the information storing capacitive elements C and the contact holes 20). Accordingly, even if the memory cell size is scaled, it is possible to reliably prevent a short circuit from occurring between the bit lines BL and the through-holes 48.

Furthermore, since the bit lines BL are formed of a metal (W), their sheet resistance can be reduced to as low as 2Ω/, and it is possible to read/write information at high speeds. In addition, since the bit lines BL and interconnect lines 23 to 26 (to be described later) of the peripheral circuit can be formed in one step at the same time, it is possible to simplify the process of manufacturing DRAMs. Since the bit lines BL are formed of a metal (W) having a high heat resistance and electromigration resistance, it is possible to reliably prevent disconnection even if the width of the bit lines BL is scaled to a far smaller size.

The first-layer interconnect lines 23 to 26 are formed over the silicon oxide film 28 of the peripheral circuit. These interconnect lines 23 to 26 are formed of the same conducting material (W) as the bit lines BL, and are formed at the same time in the step of forming the bit lines BL, as will be described later. The interconnect lines 23 to 26 are electrically connected to the MISFETs (the n-channel type MISFET Qn and the p-channel type MISFET Qp) of the peripheral circuit through contact holes 30 to 34 formed in the silicon oxide films 28, 18 and 17 and the SOG film 16.

Plugs 35, each of which is formed of a conducting film in which a Ti film, a TiN film and a W film are stacked in that order from the bottom layer, are buried in the respective contact holes 30 to 34 which interconnect the MISFETs of the peripheral circuit and the interconnect lines 23 to 26. $TiSi_2$ (titanium silicide) layers 37, which are produced by the reaction between the Ti films which constitute part of the plugs 35 and the semiconductor substrate 1 (Si), are respectively formed at the bottoms of the contact holes (30 to 33) above the sources and the drains of the MISFETs of the peripheral circuit (the $n^+$-type semiconductor regions 10 and the $p^+$-type semiconductor regions 11), whereby the contact resistance between the plugs 35 and the sources and the drains (the $n^+$-type semiconductor regions 10 and the $p^+$-type semiconductor regions 11) is reduced.

A silicon oxide film 38 is formed over the bit lines BL and the first-layer interconnect lines 23 to 26, and a SOG film 39 is formed over the silicon oxide film 38. The surface of the SOG film 39 is flattened to be approximately equal in height over the entire area of the semiconductor substrate 1.

A silicon nitride film 44 is formed over the SOG film 39 of the memory array, and the information storing capacitive elements C are formed above the silicon nitride film 44. Each of the information storing capacitive elements C includes a lower electrode (storage electrode) 45, an upper electrode (plate electrode) 47, and a $Ta_2O_5$ (tantalum oxide) film 46 formed between the electrodes 45 and 47. The lower electrode 45 is formed of a low-resistance polycrystalline silicon film doped with, for example, P (phosphorous), and the upper electrode 47 is formed of, for example, a TiN film.

The lower electrode 45 of the information storing capacitive element C is formed in an elongate pattern extending straightforwardly in the X-direction as viewed in FIG. 4. The lower electrode 45 is electrically connected to the plug 21 in the contact hole 20 through a plug 49 buried in the through-hole 48 which extends through the silicon nitride film 44, the SOG film 39 and the underlying silicon oxide films 38 and 28, and is further electrically connected to either one of the source and the drain (the n-type semiconductor regions 9) of the memory cell selecting MISFET Qs via the plug 21. The through-hole 48 which is formed between the lower electrode 45 and he contact hole 20 has a diameter (for example, 0.14 μm) smaller than the minimum process dimension in order to reliably prevent a short circuit from occurring between the bit line BL or the underlying plug 35. The plug 49 buried in the through-hole 48 is formed of a low-resistance polycrystalline silicon film doped with P (phosphorous).

A silicon oxide film 50 having a large film thickness, which is approximately equal in height to the lower electrode 45 of the information storing capacitive element C, is formed over the SOG film 39 of the peripheral circuit. Since the silicon oxide film 50 of the peripheral circuit is formed with such a large film thickness, the surface of an interlayer insulating film 56 which is formed above the information storing capacitive elements C is approximately equal in height between the memory array and the peripheral circuit.

The interlayer insulating film 56 is formed above the information storing capacitive elements C, and second-layer interconnect lines 52 and 53 are formed above the interlayer insulating film 56. The interlayer insulating film 56 is formed of a silicon oxide film, and the second-layer interconnect lines 52 and 53 are formed of a conducting film which is mainly made of Al (aluminum). The second-layer interconnect line 53 formed in the peripheral circuit is electrically connected to the first-layer interconnect line 26 through a through-hole 54 which is formed to extend through the underlying insulating films (the interlayer insulating film 56, the silicon oxide film 50, the SOG film 39 and the silicon oxide film 38). A plug 55 which is formed of, for example, a Ti film, a TiN film and a W film is buried in the through-hole 54.

A second-layer insulating film 63 is formed above the second-layer interconnect lines 52 and 53, and third-layer interconnect lines 57, 58 and 59 are formed over the second-layer insulating film 63. The second-layer insulating film 63 is formed of an silicon oxide-based insulating film (for example, a three-layer insulating film formed of a silicon oxide film, an SOG film and a silicon oxide film), and the third-layer interconnect lines 57, 58 and 59 are formed of a conducting film which is mainly made of Al (aluminum), similarly to the second-layer interconnect lines 52 and 53.

The third-layer interconnect line 58 is electrically connected to the upper electrode 47 of the information storing capacitive element C through a through-hole 60 formed in the underlying interlayer insulating film 63 and 56, and the third-layer interconnect line 59 is electrically connected to the second-layer interconnect line 53 through a through-hole 61 formed in the underlying interlayer insulating film 63. Plugs 62 each of which is made of, for example, a Ti film, a TiN film and a W film are buried in the respective through-holes 60 and 61.

One example of a method of manufacturing the DRAM which is constructed in the above-described manner will be described below in the order of process steps with reference to FIGS. 5 to 38.

Figure 5:
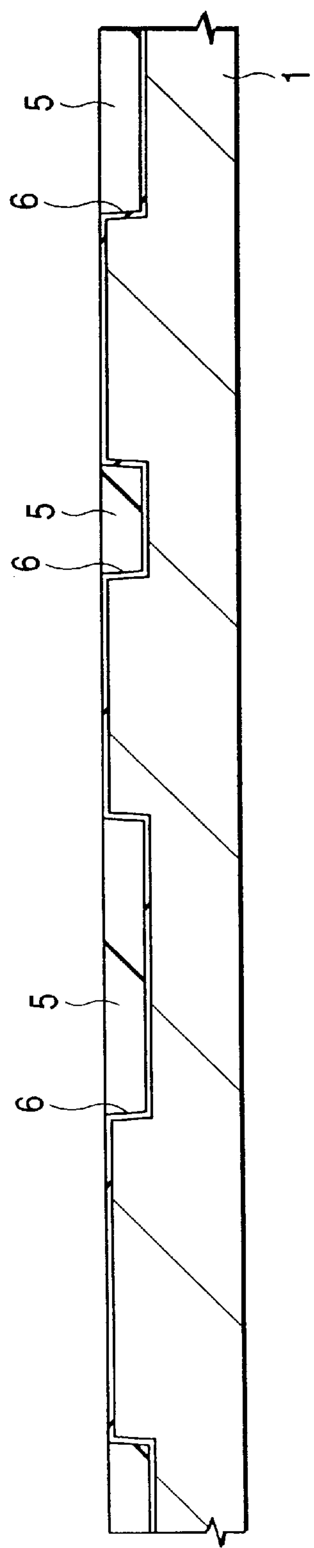
FIGS. 5 to 38 are cross-sectional views of a representative portion of a semiconductor substrate, showing the steps of a method of manufacturing the DRAM according to an embodiment of the present invention.

First of all, as shown in FIG. 5, the isolation trenches 6 are formed in the isolation regions of the principal surface of the semiconductor substrate 1 made of p-type single-crystal silicon having a resistivity of approximately 10 Ωcm. The isolation trenches 6 are formed by etching the surface of the semiconductor substrate 1 to form trenches approximately 30–400 nm deep, then depositing the silicon oxide film 5 over the semiconductor substrate 1 as well as on the interiors of the respective trenches by a CVD method, and subsequently polishing back of the silicon oxide film 5 by a chemical mechanical polishing (CMP) method.

Figure 6:
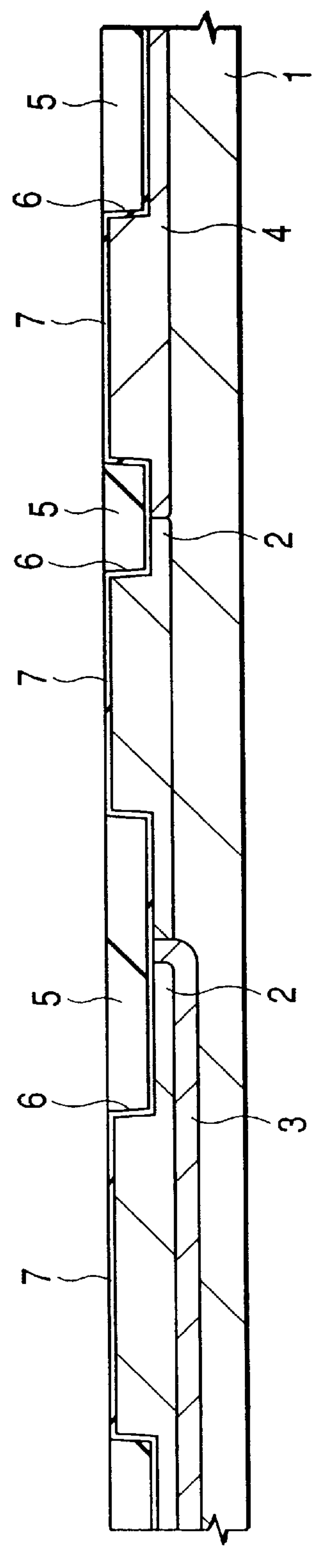

Then, as shown in FIG. 6, the n-type semiconductor area 3 is formed by ion-implanting an n-type impurity, for example, P (phosphorus), into the area (memory array) of the semiconductor substrate 1 in which memory cells are to be formed. After that, the p-wells 2 are formed by ion-implanting an p-type impurity, for example, B (boron), into a portion of the memory array and a portion of the peripheral circuit (an area in which the n-channel type MISFET Qn is to be formed), and the n-well 4 is formed by ion-implanting an n-type impurity, for example, P (phosphorus), into another portion of the peripheral circuit (an area in which the p-channel type MISFET Qp is to be formed).

Then, an impurity for adjusting the threshold voltages of the MISFETs, for example, $BF_2$ (boron fluoride), is ion-implanted into the p-wells 2 and the n-well 4, and after the surfaces of the p-wells 2 and the n-well 4 are cleaned by a HF (hydrofluoric acid)-based cleaning liquid, the semiconductor substrate 1 is wet-etched to form a clean gate oxide film 7 having a film thickness of approximately 7 nm over the surfaces of the p-wells 2 and the n-well 4.

Figure 7:
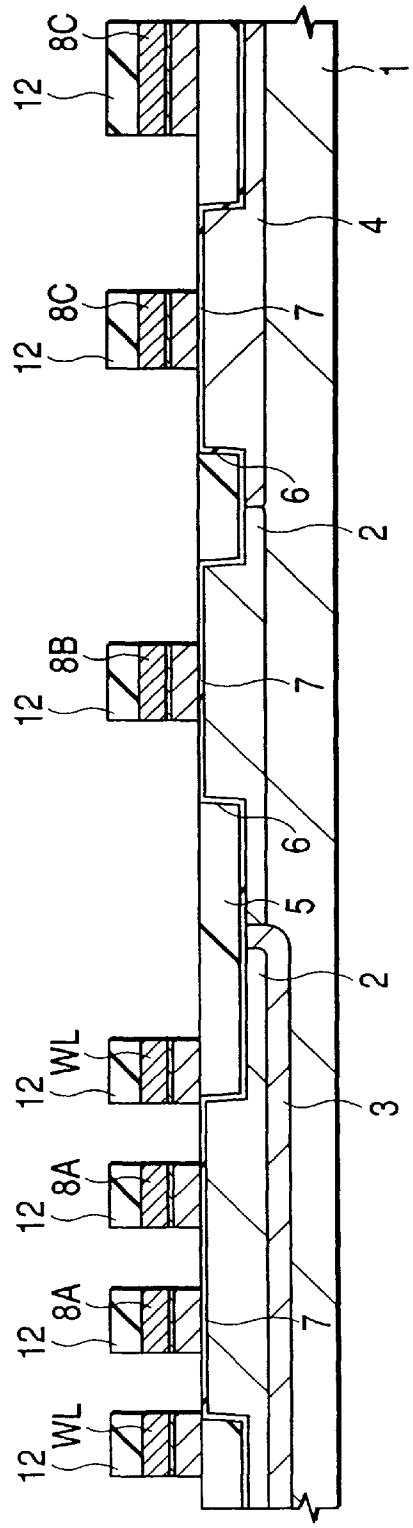

Then, as shown in FIG. 7, the gate electrodes 8A (word lines WL) and the gate electrodes 8B and 8C are formed above the gate oxide film 7. The gate electrodes 8A (word lines WL) and the gate electrodes 8B and 8C are formed by depositing an approximately-70-nm-thick polycrystalline silicon film doped with an n-type impurity such as P (phosphorous) over the semiconductor substrate 1 by a CVD method, depositing an approximately-5-nm-thick WN (tungsten nitride) film and an approximately-100-nm-thick W film over the polycrystalline silicon film by a sputtering method, depositing an approximately-200-nm-thick silicon nitride film 12 over the W film by a CVD method, and patterning these films by using a photoresist film as a mask. The WN film functions as a barrier layer which prevents the W film and the polycrystalline silicon film from reacting with each other to form a high-resistance silicide film at the interface between both films. The barrier layer may also use a WN-film high-melting-point metal film, for example, a TiN (titanium nitride) film. The gate electrodes 8A (word lines WL) of the memory cell selecting MISFETs Qs are formed by using a phase shift technique and an exposure technique which uses, for example, a KrF excimer laser having a wavelength of 248 nm as a light source.

Figure 8:
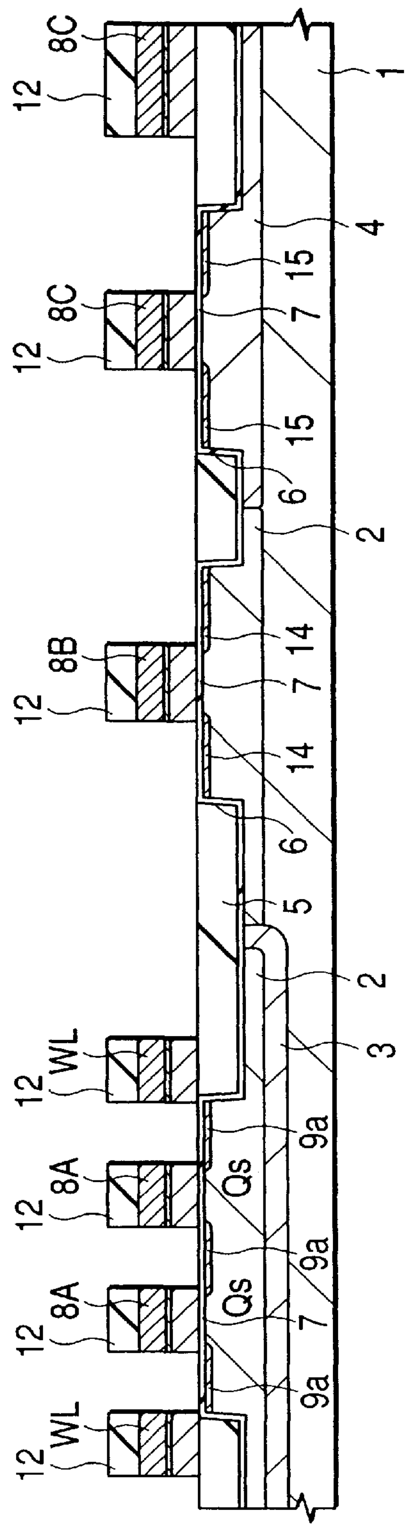

Then, as shown in FIG. 8, an p-type impurity, for example, B (boron), is ion-implanted into the n-well 4 to form $p^-$-type semiconductor regions 15 in the n-well 4 on both sides of the gate electrode 8C. In addition, an n-type impurity, for example, P (phosphorous), is ion-implanted into the n-wells 2 to form the $n^-$-type semiconductor regions 9*a* in the n-well 2 on both sides of each of the gate electrodes 8A, and to form $n^-$-type semiconductor regions 14 in the p-well 2 on both sides of the gate electrode 8B. Through the above-described process steps, the memory cell selecting MISFETs Qs are approximately finished.

Figure 9:
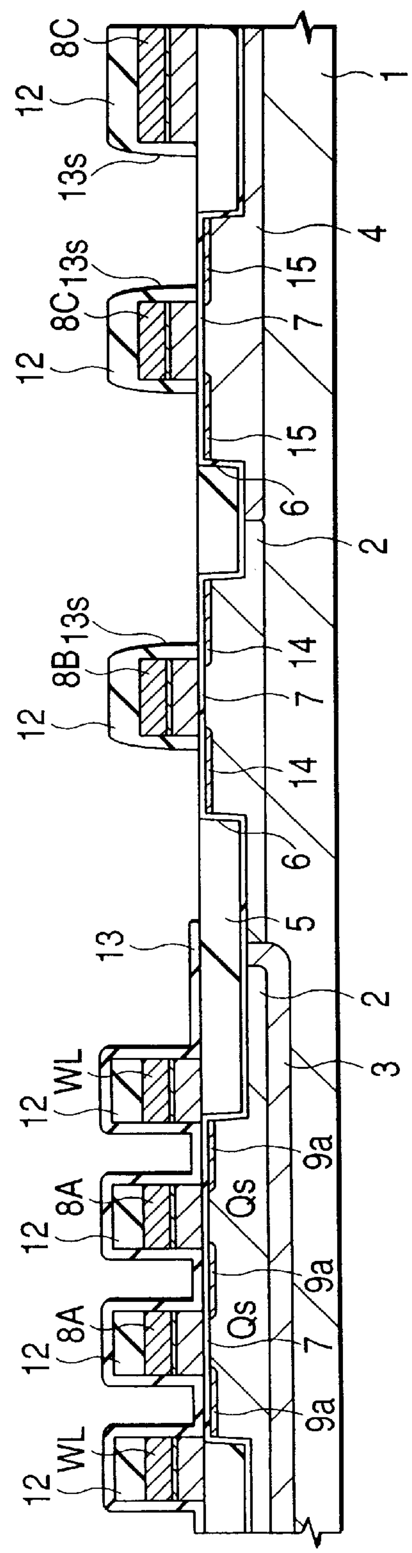

Then, as shown in FIG. 9, after an approximately-50-nm-thick silicon nitride film 13 is deposited over the semiconductor substrate 1 by a CVD method, the portion of the silicon nitride film 13 which is deposited over the memory array is covered with a photoresist film and the portion of the silicon nitride film 13 which is deposited over the peripheral circuit is anisotropically etched away to form the sidewall spacers 13s over the sidewalls of the gate electrodes 8B and 8C of the peripheral circuit. This etching is performed by using a gas which etches the silicon nitride film 13 at a high selectivity, so as to minimize the amount of cutting of the silicon oxide film 5 buried in the isolation trenches 6 as well as the gate oxide film 7. In addition, to minimize the amount of cutting of the silicon nitride film 12 of the gate electrodes 8B and 8C, the amount of overetching is reduced to the necessary minimum amount.

Figure 10:
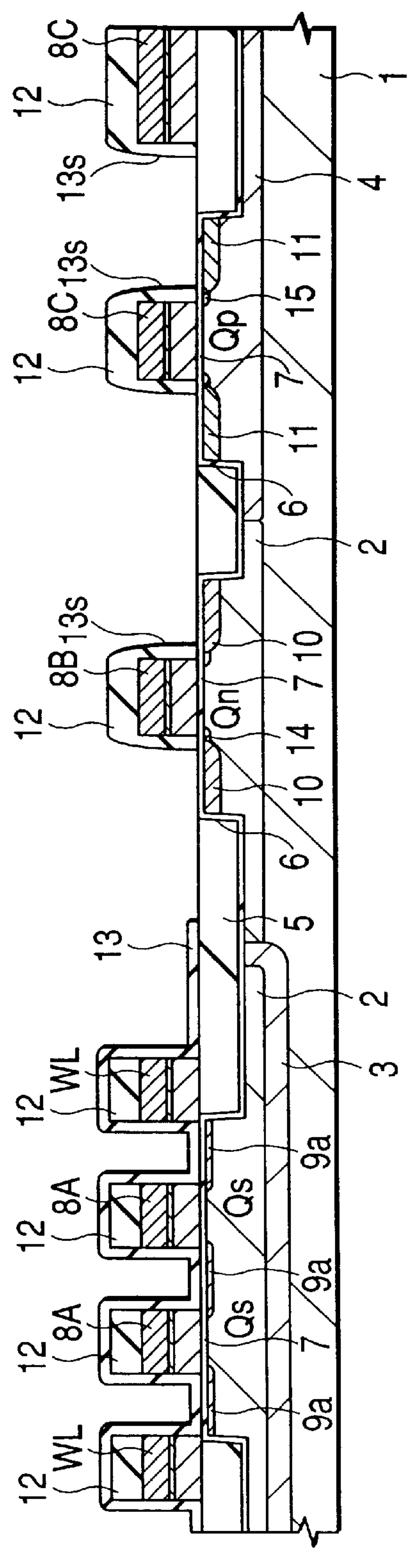

Then, as shown in FIG. 10, a p-type impurity, for example, B (boron), is ion-implanted into the n-well 4 of the peripheral circuit to form the $p^+$-type semiconductor regions 11 (source and drain) of the p-channel type MISFET Qp, and an n-type impurity, for example, As (arsenic), is ion-implanted into the n-well 4 of the peripheral circuit to form the $n^+$-type semiconductor regions 10$a$ (source and drain) of the n-channel type MISFET Qn. Through the above-described process steps, the p-channel type MISFET Qp and the n-channel type MISFET Qn each having an LDD structure are approximately finished.

Figure 11:
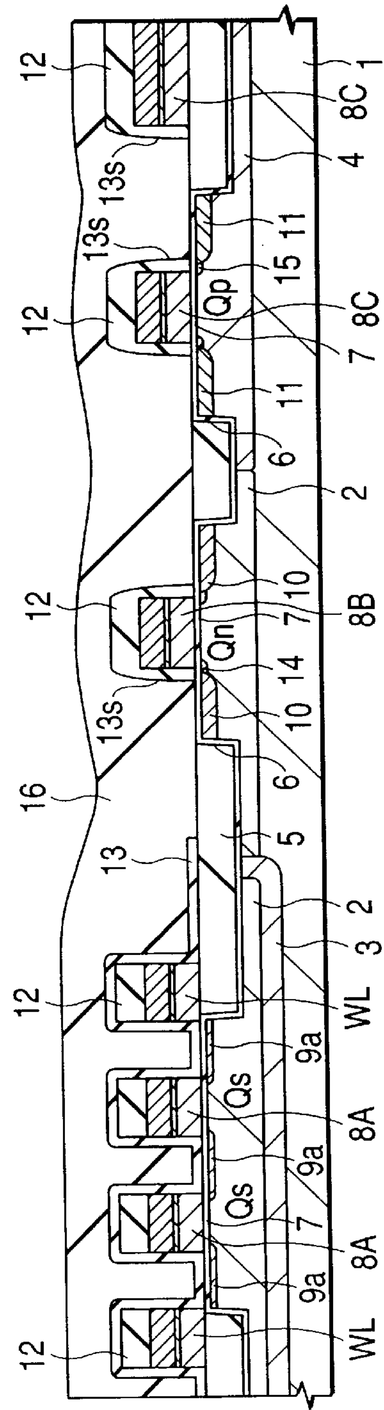

Then, as shown in FIG. 11, an approximately-300-nm-thick SOG film 16 is formed over the semiconductor substrate 1 by spin coating, and after the SOG film 16 is baked in an oxygen atmosphere of approximately 400° C. which contains water vapor, the SOG film 16 is densified by an approximately-one-minute heat treatment of 800° C. The SOG film 16 uses, for example, a polysilazane-based inorganic SOG.

The SOG film 16 is high in reflow capability and superior in gap filling capability for fine spaces compared to a glass flow film such as a BPSG film, and even if the SOG film 16 is buried in the spaces between the gate electrodes 8A (word lines WL) which are scaled down to the resolution limit of photolithography, no void is produced. In addition, since the SOG film 16 can develop a high reflow capability even if the high-temperature, long-time heat treatment required for BPSG film or the like is not performed on the SOG film 16, it is possible to restrain thermal diffusion of impurities implanted in the sources and drains of the memory cell selecting MISFETs Qs or in the sources and drains of the MISFETs (the n-channel type MISFET Qn and the p-channel type MISFET Qp) of the peripheral circuit, thereby realizing shallower junctions. Moreover, since the metal (W film) which constitutes the gate electrodes 8A (the word lines WL) and the gate electrodes 8B and 8C can be restrained from being oxidized during heat treatment, it is possible to enhance the performance of the memory cell selecting MISFETs Qs and the MISFETs of the peripheral circuit.

Figure 12:
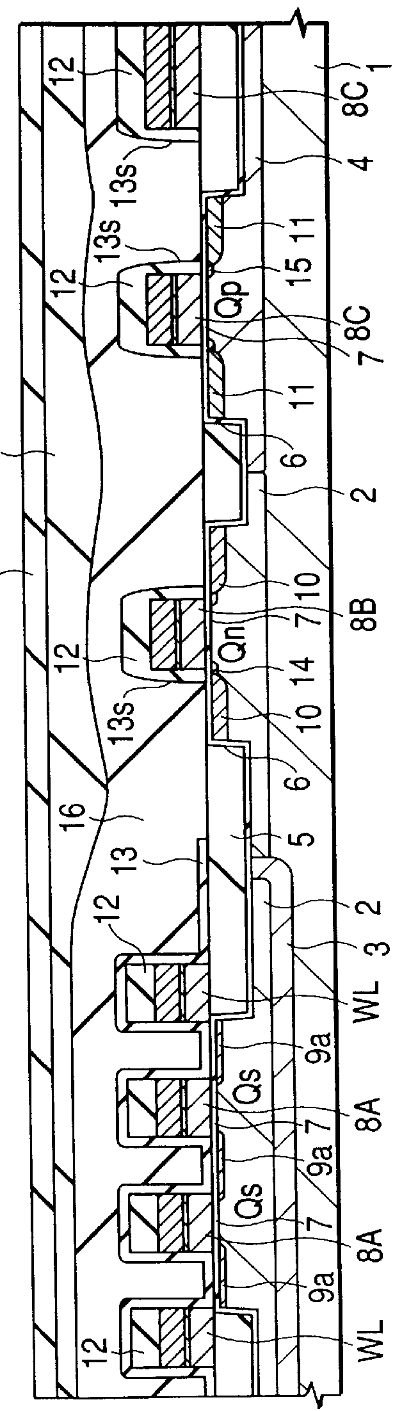

Then, as shown in FIG. 12, an approximately-600-nm-thick silicon oxide film 17 is deposited over the SOG film 16, and then, after the silicon oxide film 17 is polished by a CMP method to flatten its surface, an approximately-100-nm-thick silicon oxide film 18 is deposited over the silicon oxide film 17. The overlying silicon oxide film 18 is deposited to repair fine scratches which occur on the surface of the underlying silicon oxide film 17 when the silicon oxide film 17 is polished by a CMP method.

Figure 13:
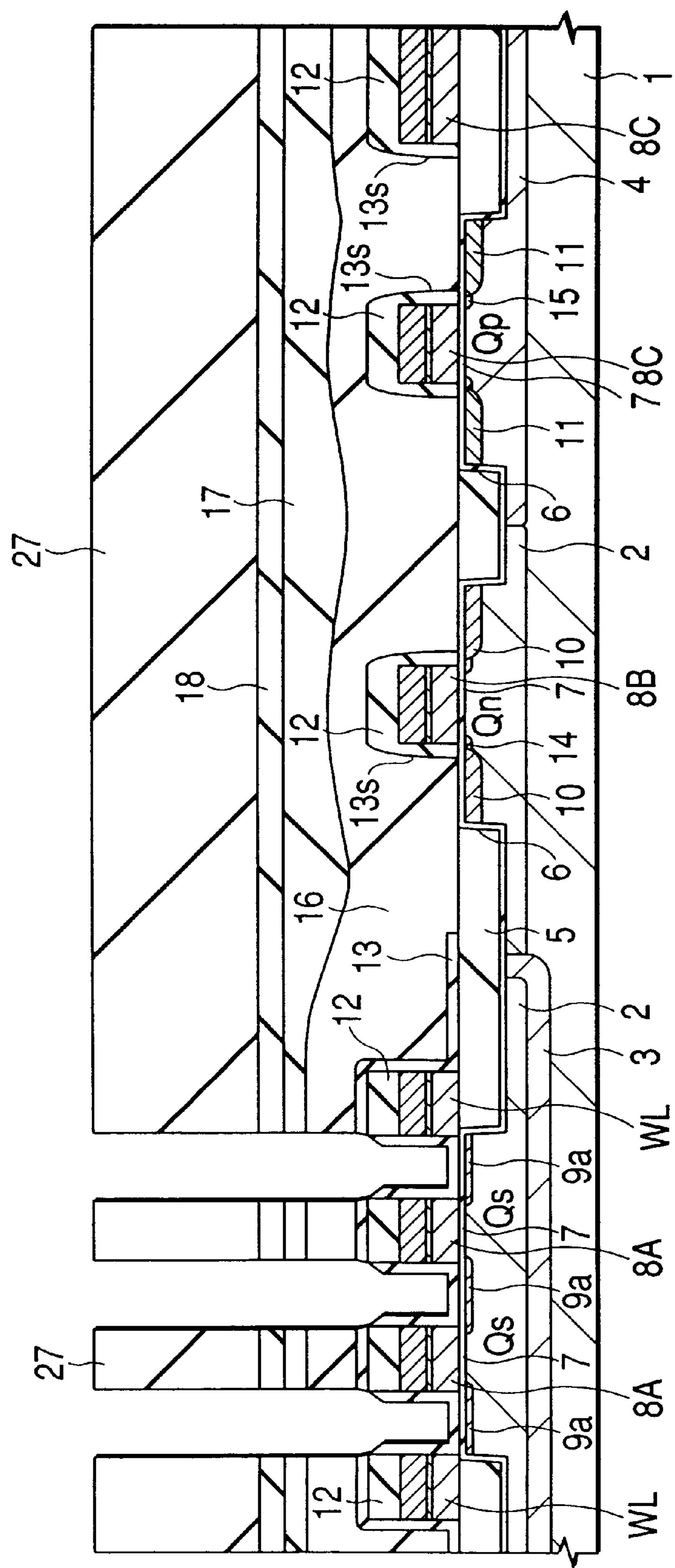

Then, as shown in FIG. 13, the silicon oxide films 18 and 17 above the $n^-$-type semiconductor regions 9$a$ (sources and drains) of the memory cell selecting MISFETs Qs are removed by dry etching which uses a photoresist film 27 as a mask. This etching is performed by using a gas which etches the silicon oxide film 17 at a high selectivity, so as to prevent the removal of the silicon nitride film 13 which underlies the silicon oxide film 17.

Figure 14:
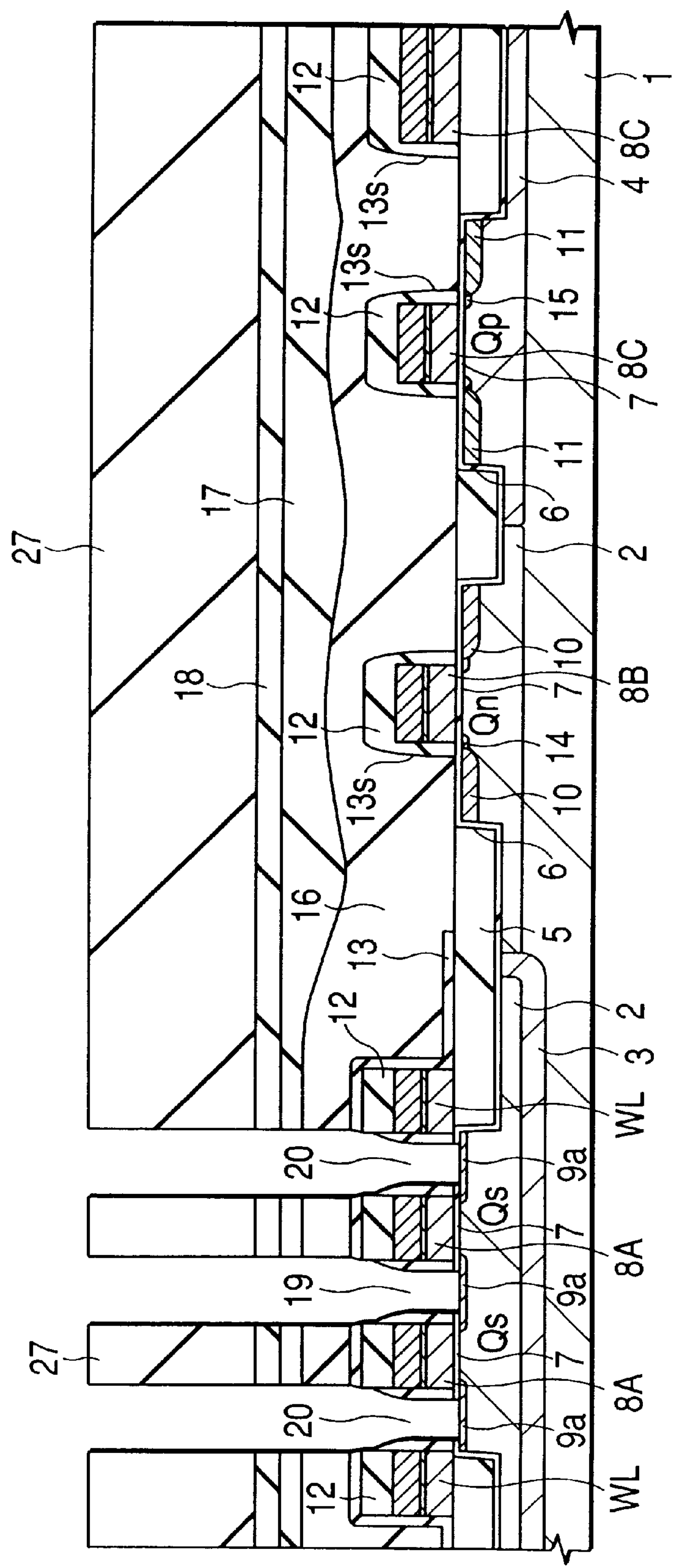

Then, as shown in FIG. 14, the silicon nitride film 13 above the $n^-$-type semiconductor regions (sources and drains) 9$a$ is removed by dry etching which uses the photoresist film 27 as a mask, and then, the underlying thin gate oxide film 7 is removed to form the contact hole 19 above one of the $n^-$-type semiconductor regions (sources and drains) 9$a$ and the contact holes 20 above the other ones.

The etching of the silicon nitride film 13 is performed by using a gas which etches the silicon nitride film 13 at a high selectivity, so as to minimize the amount of cutting of the semiconductor substrate 1 as well as the isolation trenches 6. This etching is performed under such a condition that the silicon nitride film 13 is anisotropically etched away, so as to leave the silicon nitride film 13 on the sidewalls of the gate electrodes 8A (word lines WL). Thus, the fine contact holes 19 and 20 whose bottom diameters (diameters in the X-direction) are not greater than the resolution limit of lithography can be formed by self-alignment with respect to the spaces between the gate electrodes 8A (word lines WL).

Then, after the photoresist film 27 is removed, a hydrofluoric acid-based cleaning liquid (for example, a mixture of hydrofluoric acid and ammonium fluoride) is used to clean the surface of the semiconductor substrate 1 which is exposed at the bottom of each of the contact holes 19 and 20, thereby removing drying etching residues, photoresist residues and the like. At this time, the SOG film 16 exposed at the sidewalls of the contact holes 19 and 20 is exposed to the etchant, but since the SOG film 16 which is densified at a high temperature of approximately 800° C. has a high resistance to the hydrofluoric acid-based cleaning liquid compared to non-densified SOG films, the sidewalls of the contact holes 19 and 20 are not undercut to a great extent by this wet etching treatment. Thus, it is possible to reliably prevent a short circuit from occurring between the plugs 21 to be buried in the respective contact holes 19 and 20 in the next process step.

After the contact holes 19 and 20 are formed, an n-type semiconductor layer may also be formed in the region of the p-well 2 which is deeper than the sources and drains of the memory cell selecting MISFETs Qs, by ion-implanting an n-type impurity (for example, phosphorus) into the p-well 2 through the contact holes 19 and 20. The n-type semiconductor layer has the effect of relaxing electric fields which concentrate on the edge portions of the sources and drains, and is capable of decreasing leakage current at the edge portions of the sources and drains and improving the refresh characteristics.

Figure 15:
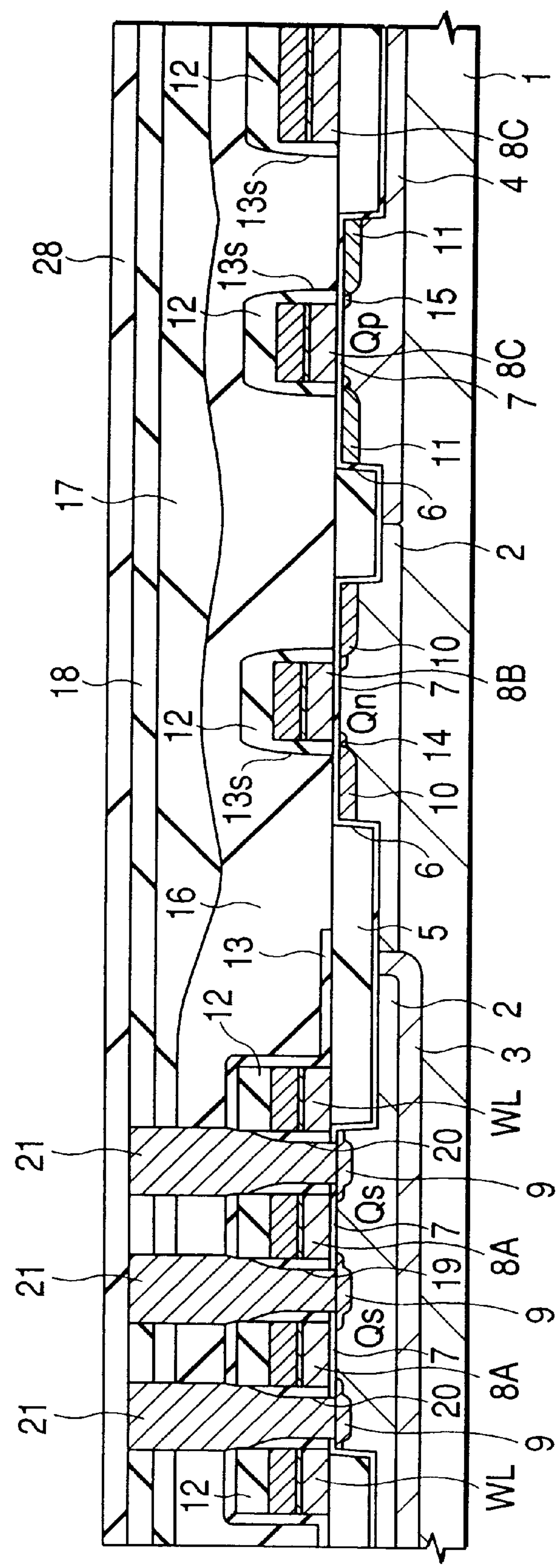

Then, as shown in FIG. 15, the plugs 21 are formed in the respective contact holes 19 and 20. The plugs 21 are formed by depositing an approximately-300-nm-thick polycrystalline silicon film doped with an n-type impurity (for example, As (arsenic)) over the silicon oxide film 18 by a CVD method and polishing the polycrystalline silicon film by a CMP method to leave the polycrystalline silicon film in only the contact holes 19 and 20.

Then, after an approximately-200-nm-thick silicon oxide film 28 is deposited over the silicon oxide film 18 by a CVD method, heat treatment is performed in a nitrogen gas atmosphere at 800° C. for approximately one minute. Through this heat treatment, the n-type impurity in the polycrystalline silicon film which constitutes the plugs 21 is diffused from the bottoms of the contact holes 19 and 20 into the $n^-$-type semiconductor regions 9$a$ of the memory cell selecting MISFETs Qs, whereby the low-resistance n-type semiconductor regions (source and drain) 9 are formed.

Figure 16:
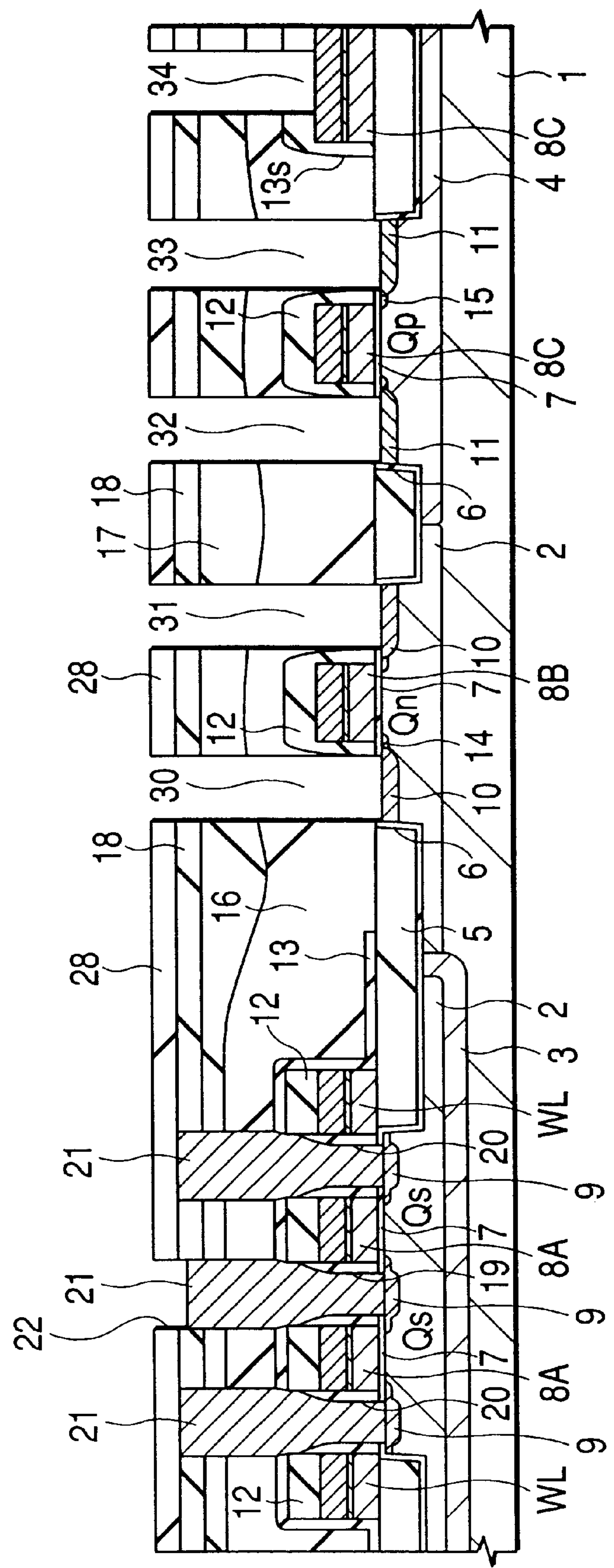

Then, as shown in FIG. 16, the through-hole 22 is formed by removing the silicon oxide film 28 from the top of the contact hole 19 by dry etching using a photoresist film as a mask. This through-hole 22 is arranged above the isolation trench 6 displaced from the active region L.

Then, the silicon oxide films 28, 18 and 17, the SOG film 16 and the gate oxide film 7 of the peripheral circuit are removed by dry etching using a photoresist film as a mask, whereby the respective contact holes 30 and 31 are formed above the $p^+$-type semiconductor regions (source and drain) 11 of the n-channel type MISFET Qn and the respective contact holes 32 and 33 are formed above the $p^+$-type semiconductor regions (source and drain) 11 of the p-channel type MISFET Qp. At the same time, the contact hole 34 is formed above the gate electrode 8C of the p-channel type MISFET Qp and a contact hole (not shown) is formed above the gate electrode 8B of the n-channel type MISFET Qn.

As described above, by performing etching for forming the through-hole 22 and etching for forming the contact holes 30 to 34 in separate process steps, it is possible to prevent the problem that the plug 21 exposed at the bottom of the shallower through-hole 22 of the memory array is deeply cut when the deeper contact holes 30 to 34 of the peripheral circuit are being formed. Incidentally, the formation of the through-hole 22 and that of the contact holes 30 to 34 may also be performed in reverse order to the above-described one.

Figure 17:
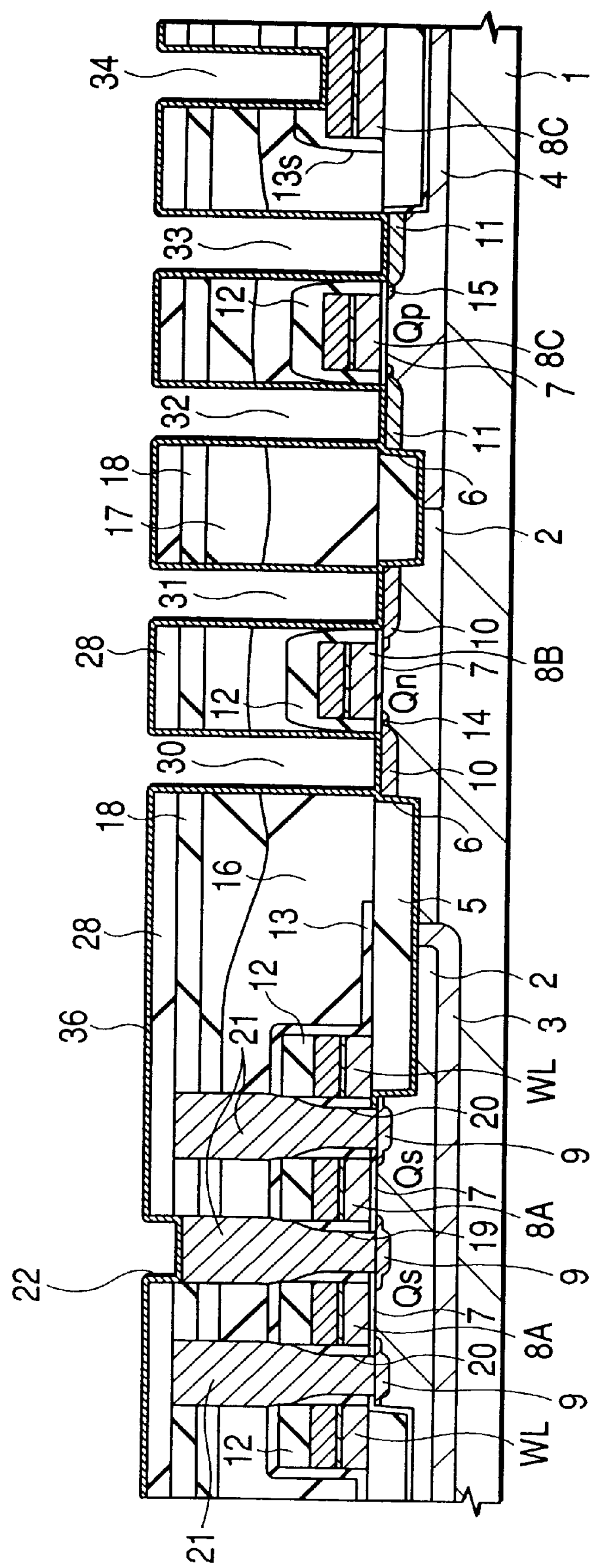

Then, as shown in FIG. 17, an approximately-40-nm-thick Ti film 36 is deposited over the silicon oxide film 28 as well as the interiors of the contact holes 30 to 34 and the through-hole 22. The Ti film 36 is deposited by using high-directivity sputtering such as collimation sputtering, so that a film thickness of approximately 100 nm or more can be ensured even at the bottoms of the contact holes 30 to 34 having large aspect ratios.

Figure 18:
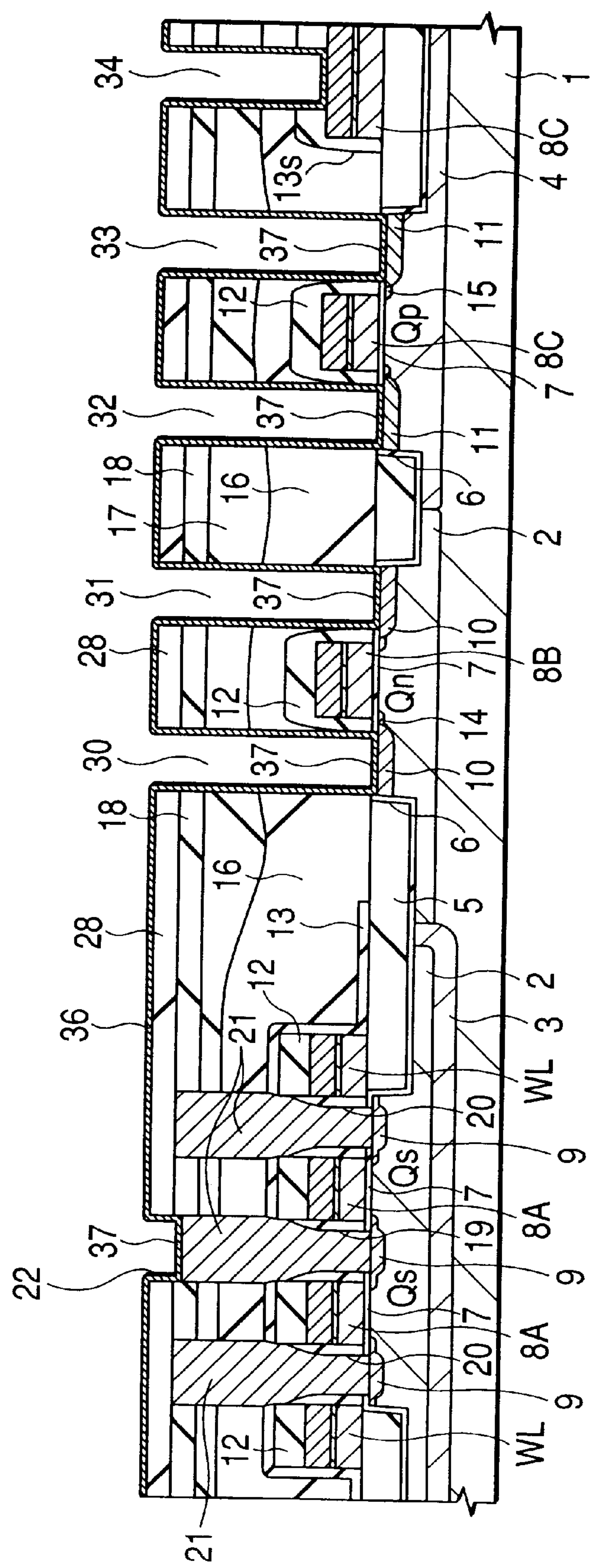

Then, heat treatment is performed in an Ar (argon) gas atmosphere at 650° C. for approximately 30 seconds without exposing the Ti film 36 to the atmosphere, and further heat treatment is performed in a nitrogen gas atmosphere at 750° C. for approximately one minute. In this heat treatment, as shown in FIG. 18, the Ti film 36 and the Si substrate react with each other at the bottoms of the contact holes 30 to 34 and an approximately-10-nm-thick $TiSi_2$ layer 37 is formed over the surfaces of the $n^+$-type semiconductor regions (source and drain) 10 of the n-channel type MISFET Qn and over the surfaces of the $p^+$-type semiconductor regions (source and drain) 11 of the p-channel type MISFET Qp. In the aforementioned heat treatment in the nitrogen gas atmosphere, the surface of the thin Ti film 36 which is deposited over the sidewalls of the contact holes 30 to 34 is nitrified and becomes a stable film which does not easily react with Si.

During this time, the surface of the Ti film 36 over the silicon oxide film 28 is also nitrified, but the portion of the Ti film 36 other than the surface remains unreacted. The $TiSi_2$ layer 37 is formed over the surface of the plug 21 at the bottom of the through-hole 22 by the reaction between the Ti film 36 and the polycrystalline silicon film which constitutes the plug 21.

By forming the TiSi2 layers 37 at the bottoms of the contact holes 30 to 34, it is possible to decrease the contact resistance to 1 kΩ or less in a portion in which the plugs 35 formed in the contact holes 30 to 33 are respectively brought into contact with the sources and drains (the $n^+$-type semiconductor regions 10 and the $p^+$-type semiconductor regions 11) of the MISFETs of the peripheral circuit in the next process step. Accordingly, it is possible to realize high-speed operation of peripheral circuits such as the sense amplifiers SA and the word drivers WD. The silicide layer at the bottom of each of the contact holes 30 to 34 may be made of high melting-point metal silicide other than $TiSi_2$, for example, $CoSi_2$ (cobalt silicide), $TaSi_2$ (tantalum silicide) or $MoSi_2$ (molybdenum silicide).

Figure 19:
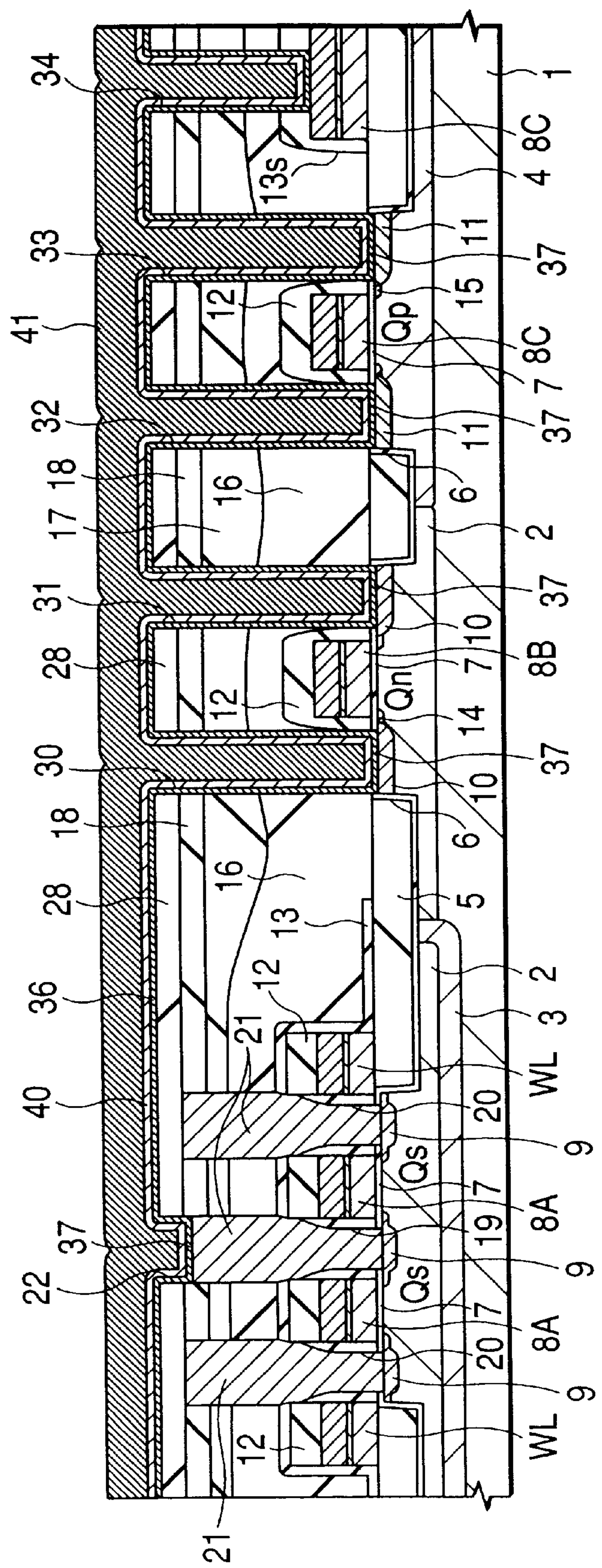

Then, as shown in FIG. 19, an approximately-30-nm-thick TiN film 40 is deposited over the Ti film 36 by a CVD method. The CVD method is superior in step coverage to the sputtering method and can deposit the TiN film 40, which is approximately equal in film thickness to the TiN film 40 deposited over the flat portion of the Ti film 36, at the bottoms of the contact holes 30 to 34 having large aspect ratios. Then, a thick W film 41 approximately 300 nm thick is deposited over the TiN film 40 by a CVD method which uses tungsten hexafluoride ($WF_6$), hydrogen, and monosilane ($SiH_4$) as a source gas, thereby completely filling the interiors of the contact holes 30 to 34 and the through-hole 22 with the W film 41.

Incidentally, if an unreacted Ti film 36 is removed with an etchant immediately after the $TiSi_2$ layer 37 is formed, the etchant flows into the interior of the contact hole 34 formed above the gate electrode 8C of the p-channel type MISFET Qp and into the interior of a contact hole (not shown) formed above the gate electrode 8B of the n-channel type MISFET Qn, so that the surfaces of the gate electrodes 8B and 8C (W films) each having a poly-metal structure are etched. To prevent this phenomenon, in the present embodiment, after the $TiSi_2$ layer 37 is formed at the bottoms of the contact holes 30 to 33, the TiN film 40 and the W film 41 are deposited above the unreacted Ti film 36 which is left on the silicon oxide film 28 and in the contact holes 30 to 34.

Figure 20:
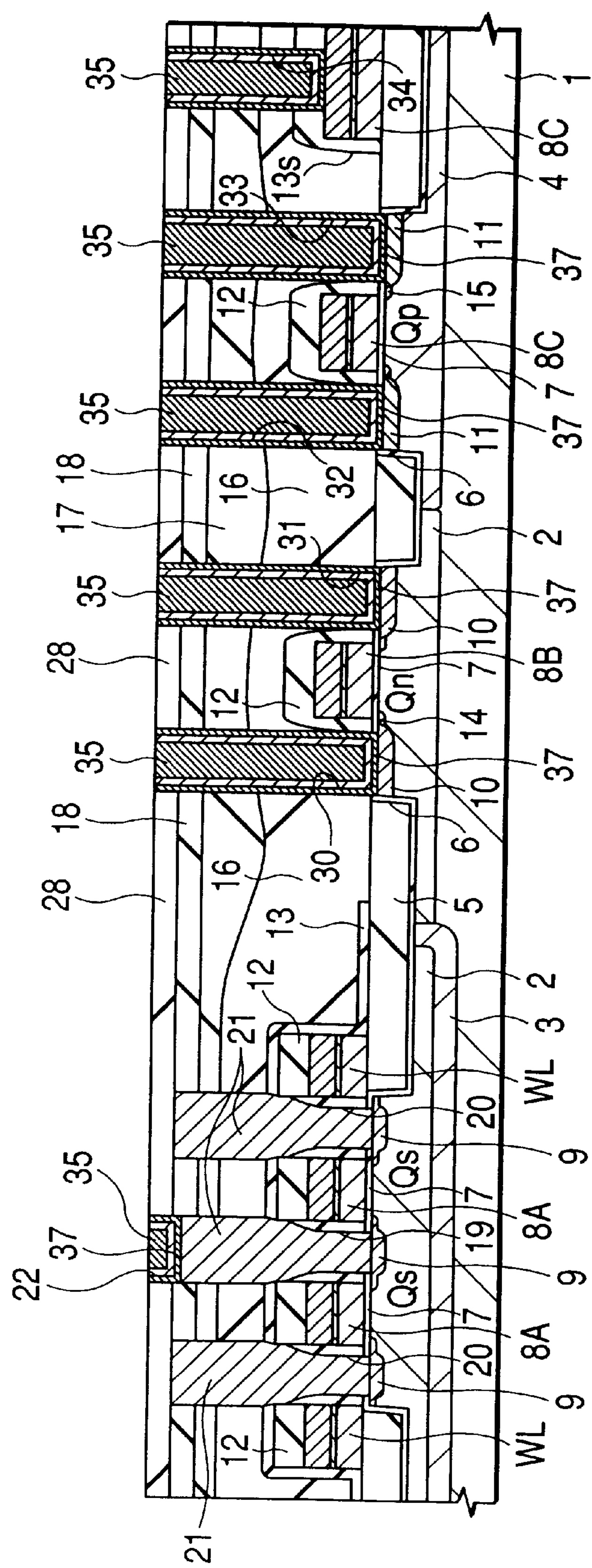

Then, as shown in FIG. 20, the plugs 35 each formed of the W film 41, the TiN film 40 and the Ti film 36 are formed in the respective contact holes 30 to 34 and the through-hole 22 by removing (polishing back) the W film 41, the TiN film 40 and the Ti film 36 formed above the silicon oxide film 28, using a CMP method. The plugs 35 may also be formed by removing (polishing back) the W film 41, the TiN film 40 and the Ti film 36 formed over the silicon oxide film 28, by dry etching. Incidentally, it is necessary to notice that if the removal of the Ti film 36 from the silicon oxide film 28 is insufficient, interconnect lines (23 to 26) to be formed over the silicon oxide film 28 in the next process step may partly peel off the surface of the silicon oxide film 28 during a later high-temperature treatment.

The plugs 35, which are mainly formed of the W film 41 which is a high melting-point metal, have a low resistance and a high heat resistance. The TiN film 40 which is formed below the W film 41 functions as a barrier layer which prevents tungsten hexafluoride and Si from reacting with each other to produce defects (encroachment or worm holes) when the W film 41 is deposited by a CVD method, and also as a barrier layer which prevents the W film 41 and the Si substrate from reacting with each other (pagesilicidication reaction) in a later high-temperature treatment step. This barrier layer may also use a high-melting-point metal nitride other than TiN (for example, WN film).

The plugs 35 may be mainly formed of the TiN film 40 without the use of the W film 41. Specifically, the plugs 35 may be formed by burying a thick TiN film 40 in each of the contact holes 30 to 34 and the through-hole 22. In this case, the plugs 35 are somewhat higher in resistance than those mainly formed of the W film 41, but the TiN film 40 serves as an etching stopper when the bit lines BL and the first-layer interconnect lines 23 to 26 of the peripheral circuit are to be formed by dry-etching a W film 42 deposited over the silicon oxide film 28 in the next process step, so that the misalignment margin between the interconnect lines 23 to 26 and the contact holes 30 to 34 is remarkably improved and the degree of freedom of layout of the interconnect lines 23 to 26 is greatly improved.

Then, the bit lines BL and the first-layer interconnect lines 23 to 26 of the peripheral circuit are formed over the silicon oxide film 28 by a method which will be described below.

Figure 21:
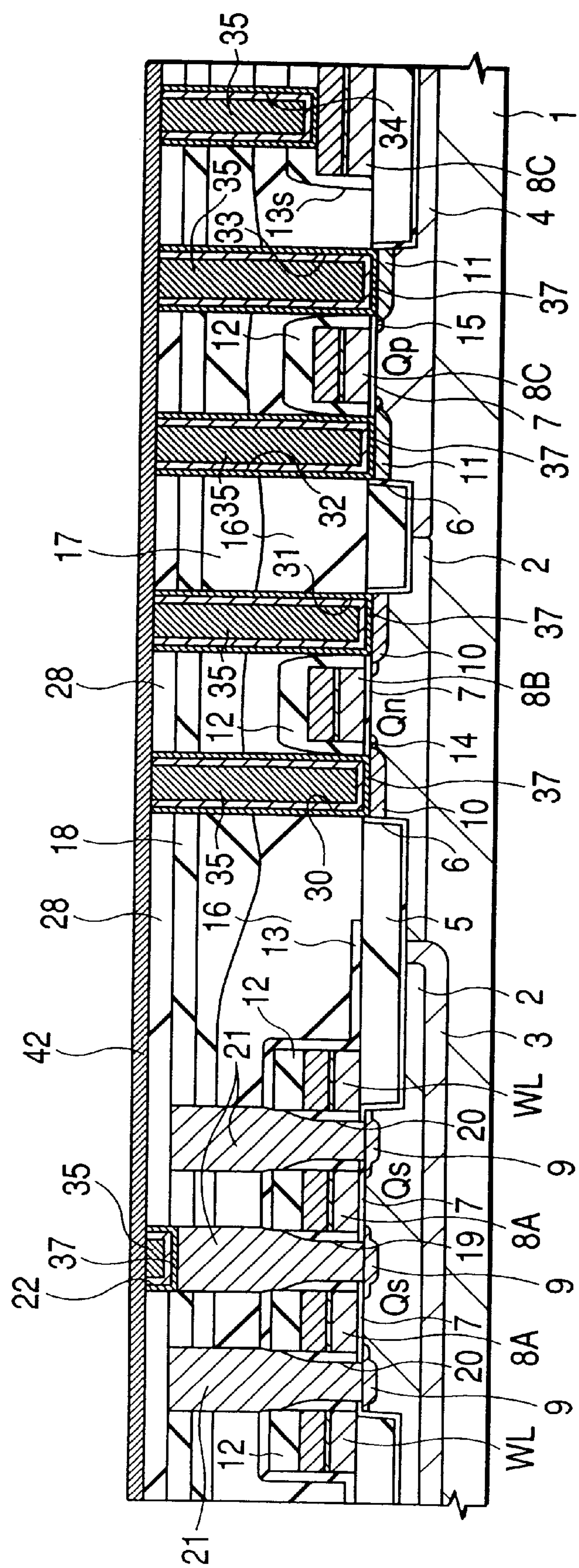
Figure 22:
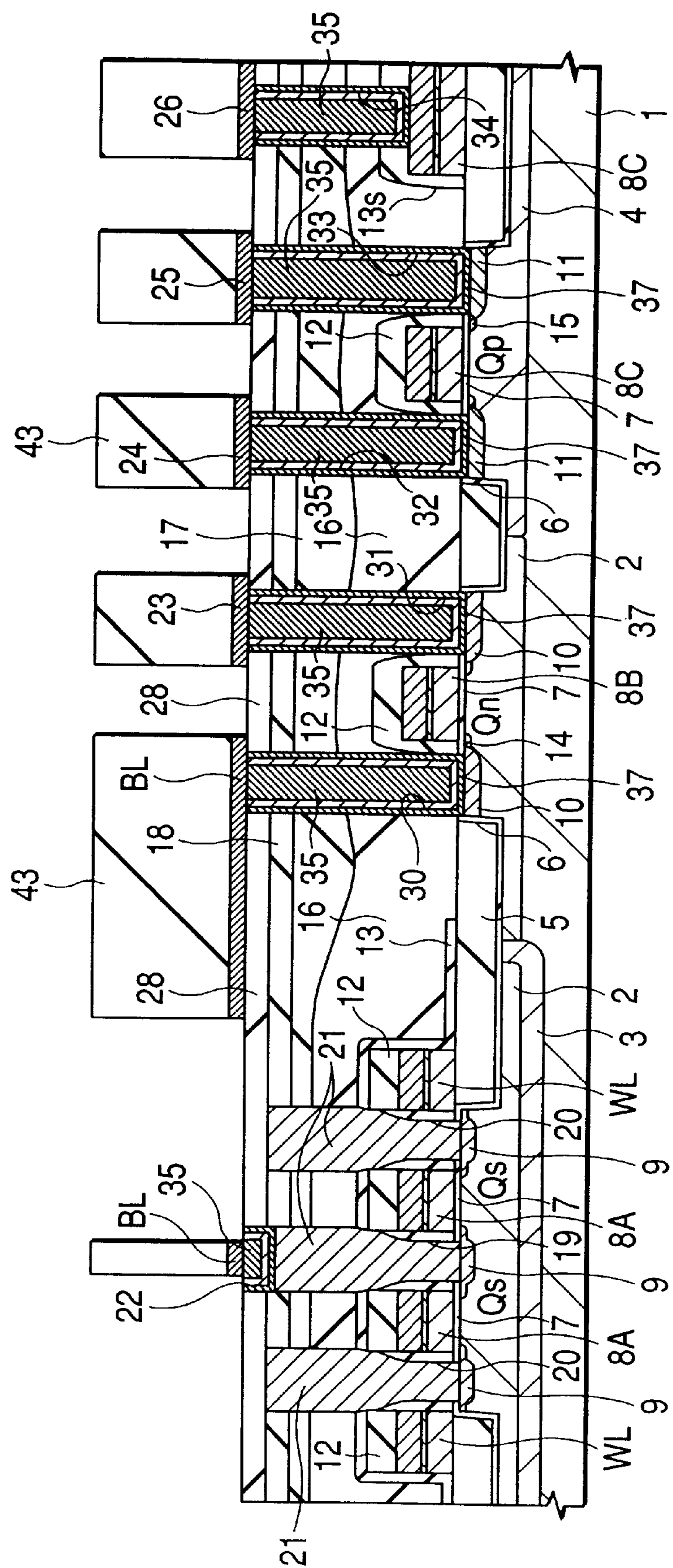

First, as shown in FIG. 21, after polish residues are fully removed from the surface of the silicon oxide film 28 by wet cleaning, an approximately-100-nm-thick W film 42 is deposited over the silicon oxide film 28 by a sputtering method. Then, as shown in FIG. 22, the bit lines BL and the first-layer interconnect lines 23 to 26 of the peripheral circuit are formed by dry-etching the W film 42 by using a photoresist film 43 formed over the W film 42 as a mask. Incidentally, since the W film 42 has a high optical reflectivity, the photoresist film 43 may cause halation during exposure and the dimensional accuracy of a pattern (width and space) may decrease. To prevent this phenomenon, after a thin anti-reflection film is deposited on the W film 42, the anti-reflection film may be coated with the photoresist film 43. The anti-reflection film may use an organic material or a metallic material of low optical reflectivity (for example, TiN film).

The result of examination of the adhesion between silicon oxide film and several kinds of metal films deposited thereon will be described below.

TABLE 1

| Sample Number | Specifications | Interfacial Status | Remark |
|---|---|---|---|
| 1 | W/TiN/Ti | Occurrence of Peeling | |
| 2 | W/TiN/TiNx | Occurrence of Peeling | x = 10% |
| 3 | W/TiN/TiNx | Occurrence of Peeling | x = 15% |
| 4 | W/TiN/TiNx | Occurrence of Peeling | x = 20% |
| 5 | W/TiN | No Peeling | |
| 6 | W | No Peeling | |

Note 1) After 5-min 800° C. nitrogen annealing
Note 2) Plasma CVD-$SiO_2$ over the base and W Table 1 shows the result obtained by depositing each of six kinds of metal films (Samples 1 to 6) over the surface of a silicon oxide film deposited by a plasma-CVD method, subjecting it to heat treatment in an 800° C. nitrogen atmosphere for five minutes, and estimating the adhesion of the interface between the metal film and the surface of the silicon oxide film. In each of the samples, the W film was deposited with a film thickness of 300 nm by a sputtering method. The TiN film of each of Samples 1 to 5 was deposited with a film thickness of 50 nm by a reactive sputtering method. The $TiN_x$ films of Samples 2, 3 and 4 are deposited to have different composition ratios (x), by a reactive sputtering method. Specifically, the composition ratios (x) were made different by adjusting the oxygen partial pressure of a gaseous mixture of Ar (argon) and nitrogen. The Ti film of Sample 1 was deposited with a film thickness of 50 nm by a reactive sputtering method.

As shown in Table 1, peeling occurred at the interface of each of Samples 1 to 4, but no peeling occurred in Samples 5 and 6. From this finding, it has been found out that film peeling occurs if high-temperature heat treatment is performed with a Ti film or a Ti compound which contains an excess amount of Ti and a silicon oxide film being in contact with each other at their interface. In this case, the energy variation of thermochemical production energy for producing oxides is such that Si forms oxides more easily than W, and Ti forms oxides far more easily than Si. Therefore, it is presumed that such inherent characteristic in each substance is the cause of the above-described film peeling. If Ti is present at the interface not as a simple substance (Ti) but as a stable nitrogen compound (TiN), energy which destroys the Ti—N coupling becomes necessary, and this is considered to be why no film peeling occurred in Sample 5.

Incidentally, in the through-hole 22 and the contact holes 30 to 34, their sidewalls remain in contact with a Ti film 22, but there is no problem because the plugs 35 in the through-hole 22 and the contact holes 30 to 34 adhere to the underlying polycrystalline silicon plug 21 or the semiconductor substrate or because the bit lines BL or the interconnect lines 23 to 26 are present above the plugs 35.

In the above-described manufacturing method, the bit lines BL and the interconnect lines 23 to 26 are formed by removing the W film 41, the TiN film 40 and the Ti film 36 deposited over the silicon oxide film 28, forming the plugs 35 in the contact holes 30 to 34 and the through-hole 22, and patterning the W film 42 newly deposited over the silicon oxide film 28. Therefore, according to this method, the number of manufacturing process steps increases as compared with the case of forming the bit lines BL and the interconnect lines 23 to 26 by patterning the W film 41, the TiN film 40 and the Ti film 36, but it is possible to reliably prevent a failure in which the bit lines BL or the interconnect lines 23 to 26 cause film peeling during high-temperature heat treatment which is performed later when the information storing capacitive element C is to be formed above the bit lines BL.

In addition, according to the above-described manufacturing method of depositing the W film 2 over the silicon oxide film 28 the for forming the bit lines BL and the interconnect lines 23 to 26, after forming the plugs 35 in the contact holes 30 to 34, each having a large aspect ratio, it is not necessary to take into account the burying of a film into the through-hole 22 and the contact holes 30 to 34 when the W film 42 is to be deposited, so that it is possible to deposit the W film 42 with a small film thickness. Specifically, according to this manufacturing method, since the film thickness of the bit lines BL can be made small, it is possible to reduce the parasitic capacitances formed between adjacent bit lines BL.

Furthermore, since the surface of the silicon oxide film 28 is polished and flattened by a CMP method and the W film 42 having a large thickness is deposited over the surface, it is possible to decrease the amount of overetching of the W film 42 during etching thereof, whereby it is possible to prevent the problem of deeply cutting the plug 35 in the through-hole 22 having a diameter larger than the width of the photoresist film 43.

The bit lines BL and the interconnect lines 23 to 26 may be formed with a W film deposited by a CVD method or a layer in which a W film and a TiN film are stacked. The bit lines BL and the interconnect lines 23 to 26 may also be formed with another high melting-point metal (for example, Mo film or Ta film) having good adhesion to a silicon oxide-based insulating film, a single-layer film of a nitride of such high melting-point metal, or a film in which such single-layer films are stacked.

Figure 23:
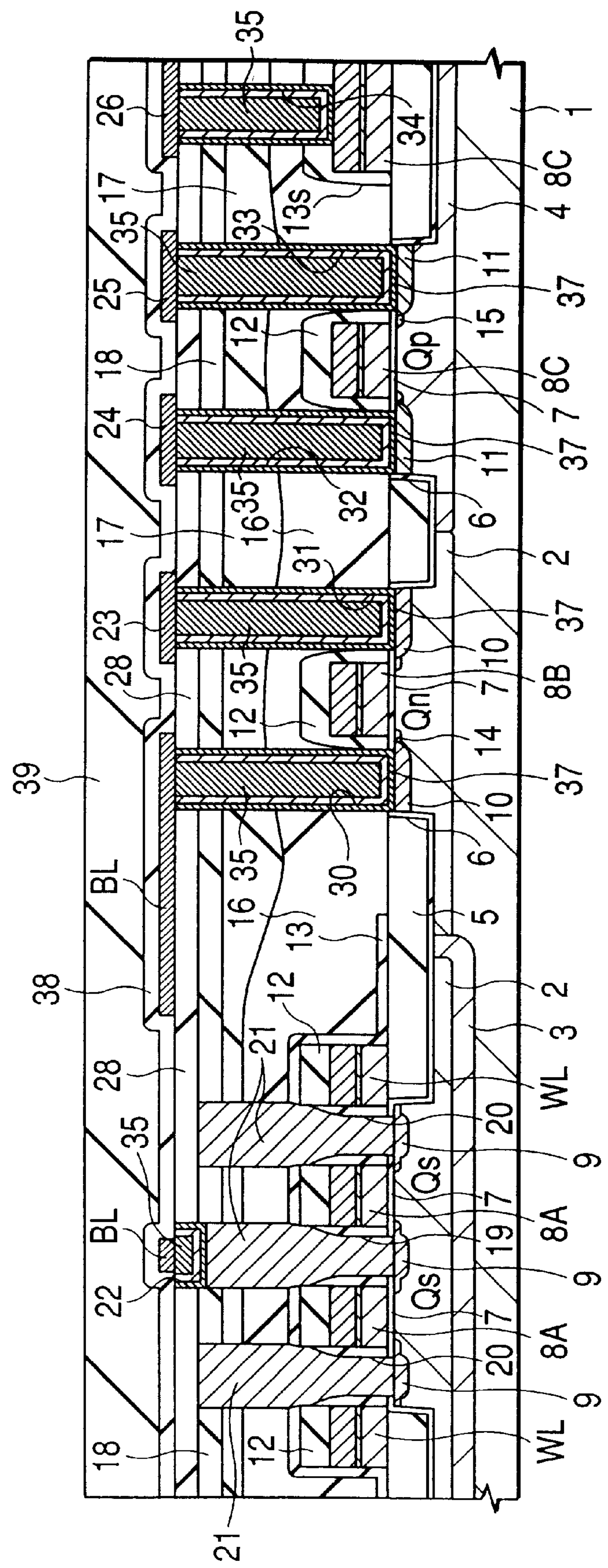

Then, as shown in FIG. 23, an approximately-100-nm-thick silicon oxide film 38 is deposited over the bit lines BL and the first-layer interconnect lines 23 to 26, and after an approximately-250-nm-thick SOG film 39 is formed over the silicon oxide film 38 by spin coating, the SOG film 39 is baked in an oxygen atmosphere of approximately 400° C. which contains water vapor. Then, the SOG film 39 is densified by an approximately-one-minute heat treatment of 800° C., whereby the surface of the SOG film 39 is flattened.

As described above, since the surface of the silicon oxide film 28 is flattened and the thin W film 42 is deposited over the surface to form the bit lines BL and the first-layer interconnect lines 23 to 26, it is possible to reduce the step height of a base portion which underlies the SOG film 39, whereby it is possible to form a flat layer over the bit lines BL and the interconnect lines 23 to 26, by using only a two-layer insulating film (the silicon oxide film 38 and the SOG film 39). Specifically, it is possible to ensure sufficient flatness without the need to deposit a silicon oxide film (17) over an SOG film (16) and polish the surface of the silicon oxide film by a CMP method similarly to the process step of flattening the tops of the gate electrodes 8A, 8B and 8C, whereby it is possible to reduce the number of process steps.

Incidentally, if the step height due to the bit lines BL and the first-layer interconnect lines 23 to 26 is small, it is possible to form a flat layer merely by thickly depositing a silicon oxide film 38 without using the SOG film 39. On the other hand, if the difference in density between the bit lines BL and the interconnect lines 23 to 26 is large and no sufficient flatness can be obtained with only the SOG film 39, the surface of the SOG film 39 may be polished by a CMP method and a silicon oxide film for repairing fine scratches on the surface of the SOG film 39 may also be deposited over the SOG film 39. If the temperature required to densify the SOG film 39 cannot be made very high, a silicon oxide film may also be deposited over the SOG film 39 to compensate for a decrease in the humidity resistance thereof.

Figure 24:
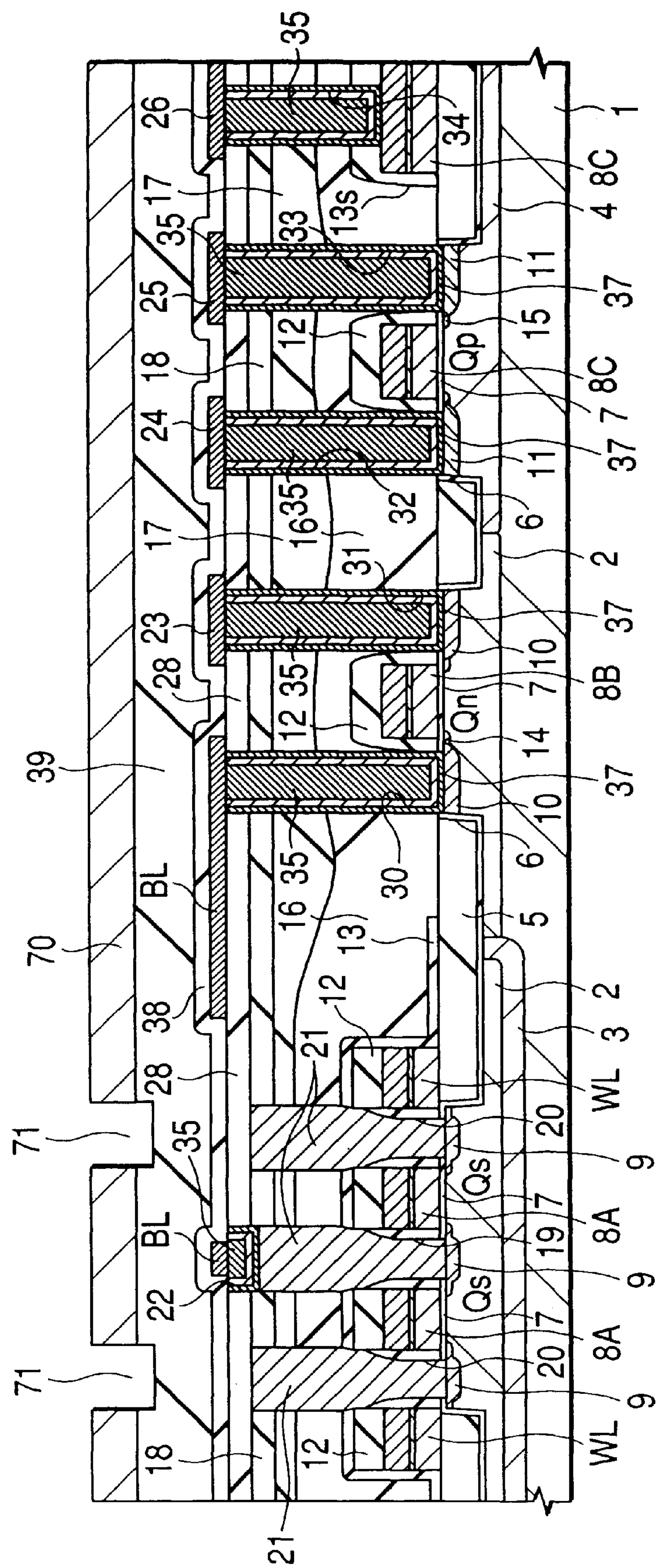

Then, as shown in FIG. 24, through-holes 71 are formed above the contact holes 20 by depositing an approximately-200-nm-thick polycrystalline silicon film 70 over the SOG film 39 by a CVD method, and dry-etching the polycrystalline silicon film 70 by using a photoresist film as a mask. These through-holes 71 are formed to be approximately equal in diameter to their minimum process dimensions.

Figure 25:
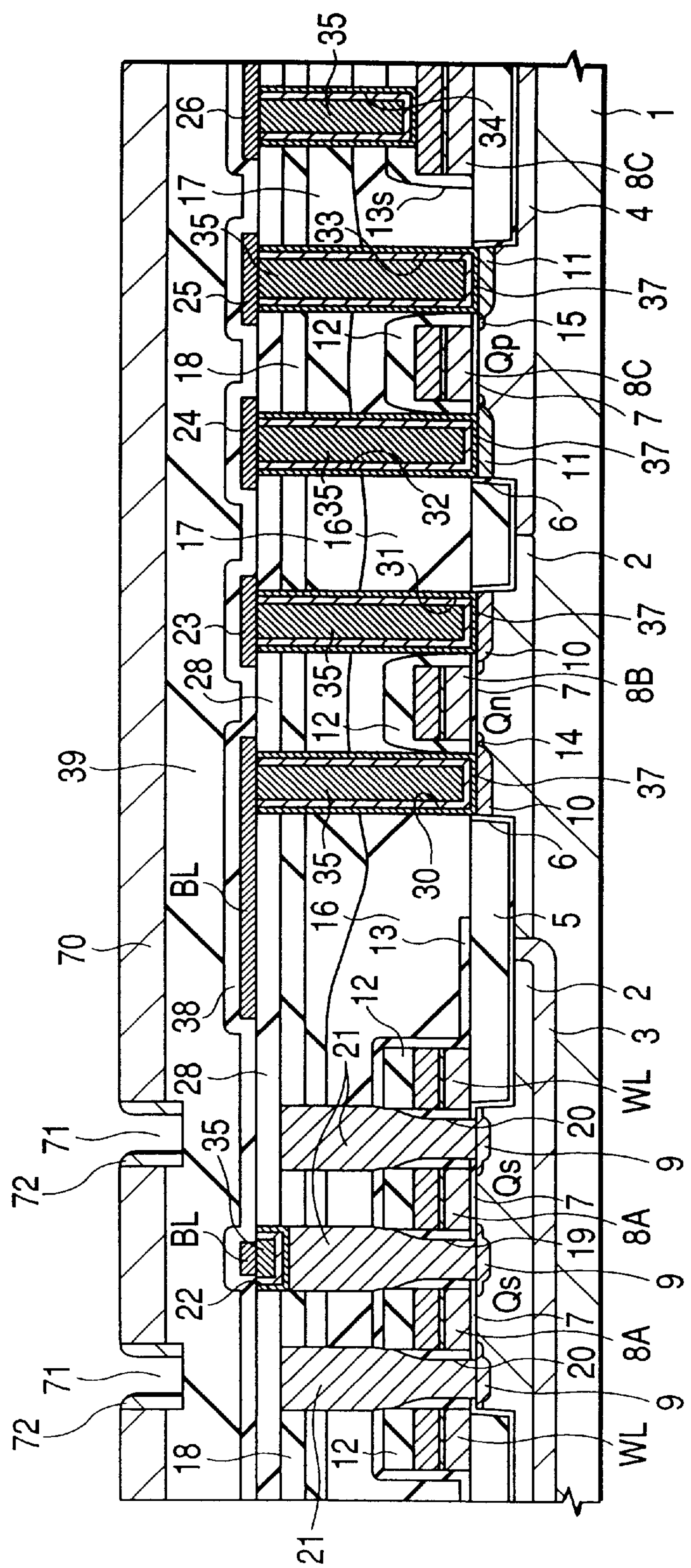

Then, as shown in FIG. 25, sidewall spacers 72 each made of a polycrystalline silicon film are respectively formed over the sidewalls of the through-holes 71. The sidewall spacers 72 are formed by depositing a second polycrystalline silicon film which is as thin as approximately 60 nm (not shown) over the polycrystalline silicon film 70 as well as on the interiors of the through-holes 71, and then etching back the polycrystalline silicon film to leave it on the sidewalls of the through-holes 71. By forming the sidewall spacers 72, the inner diameter of each of the through-holes 71 becomes smaller than the minimum process dimension.

Figure 26:
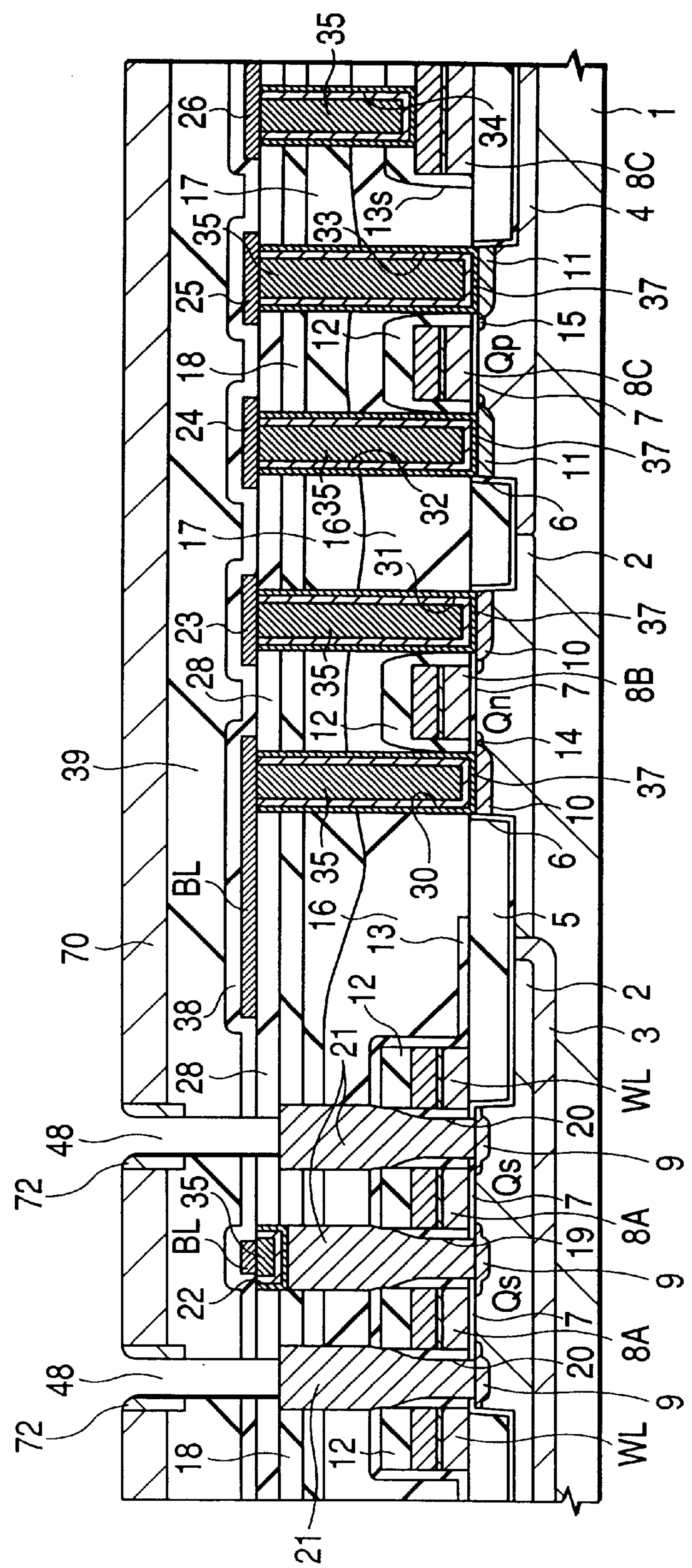

Then, as shown in FIG. 26, the through-holes 48 which reach the respective contact holes 20 through the area between a bit line BL and an adjacent bit line BL are formed by dry-etching the insulating films (the SOG film 39 and the silicon oxide films 38 and 28) which underlie the through-holes 71, using the polycrystalline silicon film 70 and the sidewall spacers 72 as a mask.

Since the through-holes 48 are formed by using as a mask the sidewall spacers 72 on the sidewalls of the through-holes 71 each having an inner diameter smaller than the minimum process dimension, the inner diameters of the through-holes 48 are smaller than their minimum process dimensions. Accordingly, it is possible to fully ensure the alignment margin between the space areas between the bit line BL and the through-holes 48, whereby it is possible to reliably prevent a short circuit from occurring between the plugs 49 to be buried in the through-holes 48 in the next process step and the bit line BL or the underlying plug 35.

Figure 27:
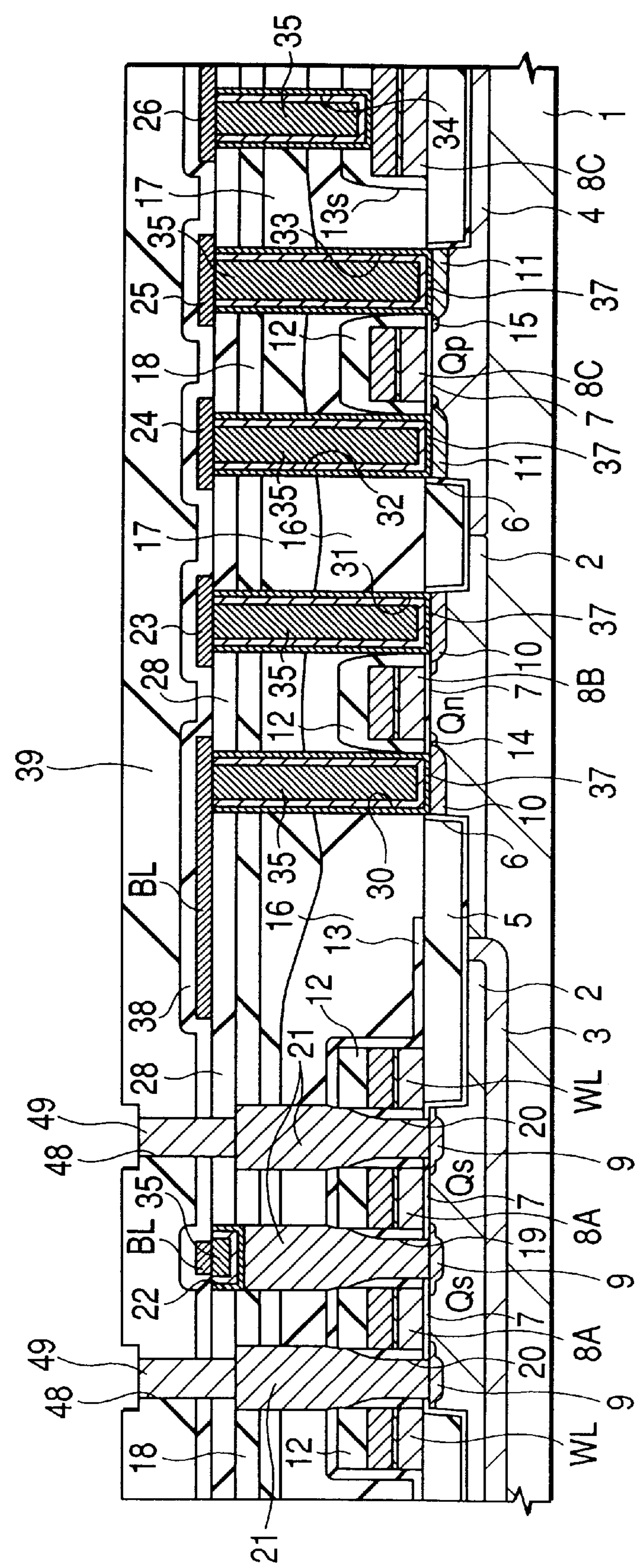

Then, as shown in FIG. 27, an approximately-200-nm-thick polycrystalline silicon film (not shown) doped with an n-type impurity such as P (phosphorous) is deposited over the polycrystalline silicon film 70 as well as the interiors of the through-holes 48 by a CVD method, and the polycrystalline silicon film is etched back together with the polycrystalline silicon film 70 and the sidewall spacers 72 to form the plugs 49 made of the polycrystalline silicon film in the respective through-holes 48.

Figure 28:
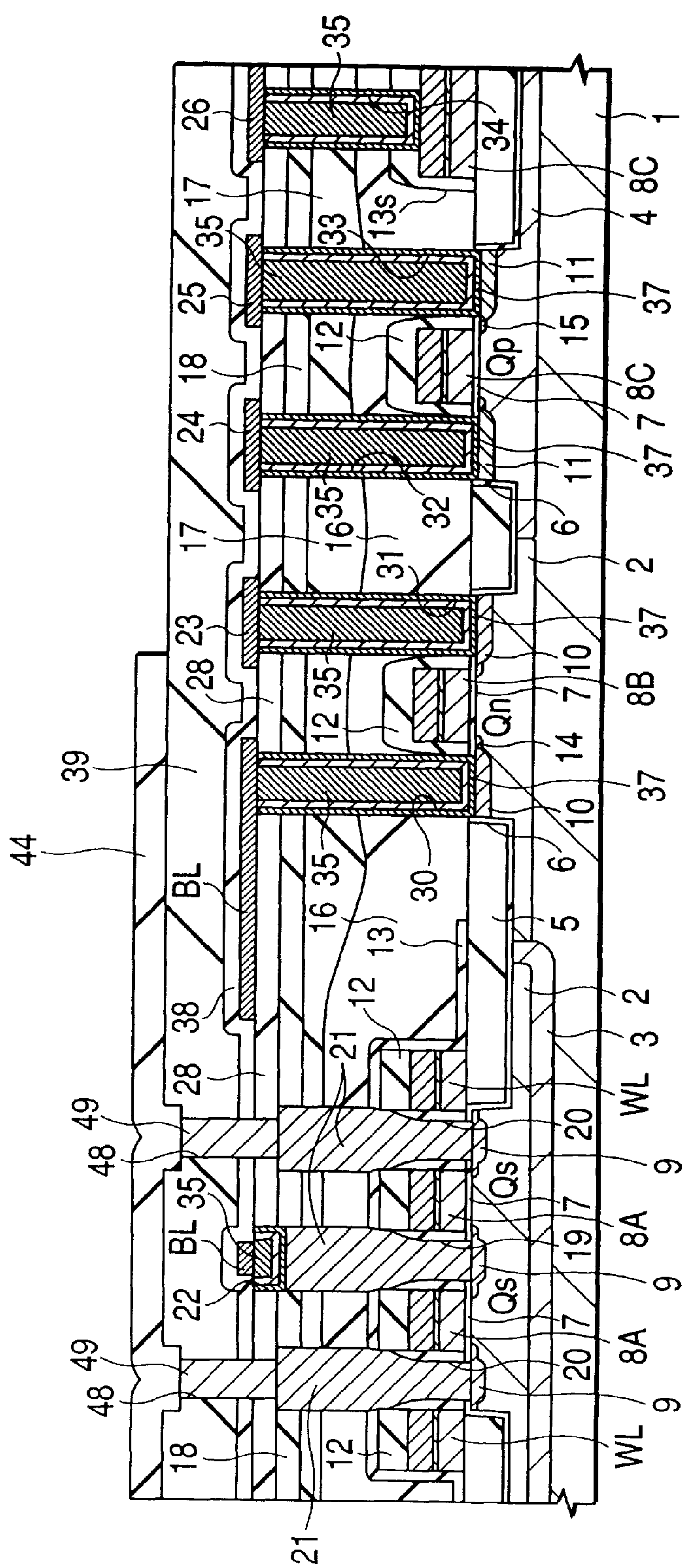

Then, as shown in FIG. 28, an approximately-200-nm-thick silicon nitride film 44 is deposited over the SOG film 39 by a CVD method, and the portion of the silicon nitride film 44 which overlies the peripheral circuit is removed by dry etching using a photoresist film as a mask. The silicon nitride film 44 which is left over the memory array is used as an etching stopper when an silicon oxide film is being etched in the step of forming the lower electrodes 45 of the information storing capacitive elements C to be described later.

Figure 29:
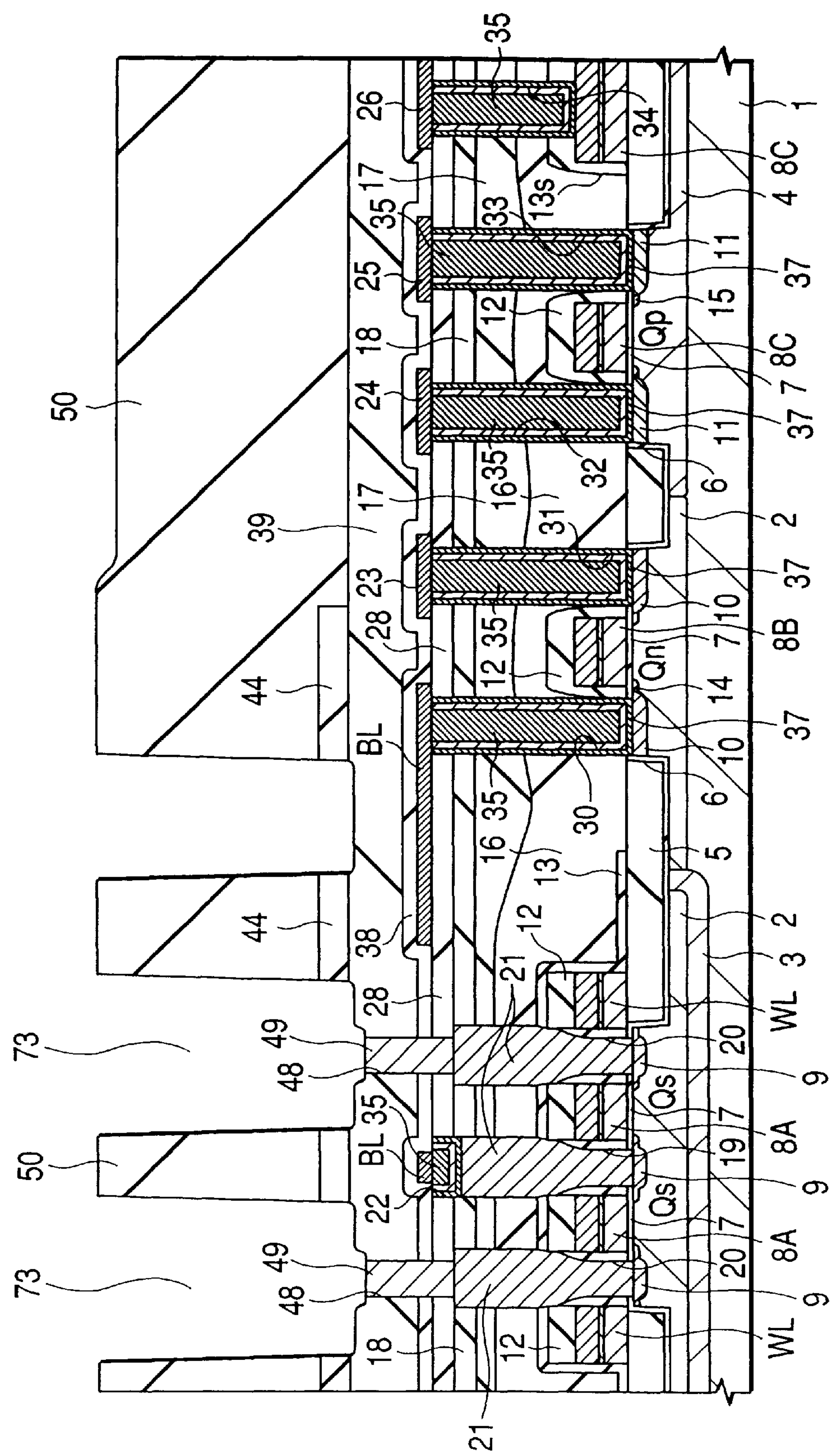

Then, as shown in FIG. 29, the silicon oxide film 50 is deposited over the silicon nitride film 44 by a CVD method, and the silicon oxide film 50 and the underlying silicon nitride film 44 are dry-etched using a photoresist film as a mask, thereby forming recesses 73 above the respective through-holes 48. Since the respective lower electrodes 45 of the information storing capacitive elements C are formed along the inner walls of the recesses 73, it is necessary to deposit the silicon oxide film 50 with a large film thickness (for example, approximately 1.3 $\mu$me) so that the surface area of each of the lower electrodes 45 can be increased to increase the charge storage quantity.

Figure 30:
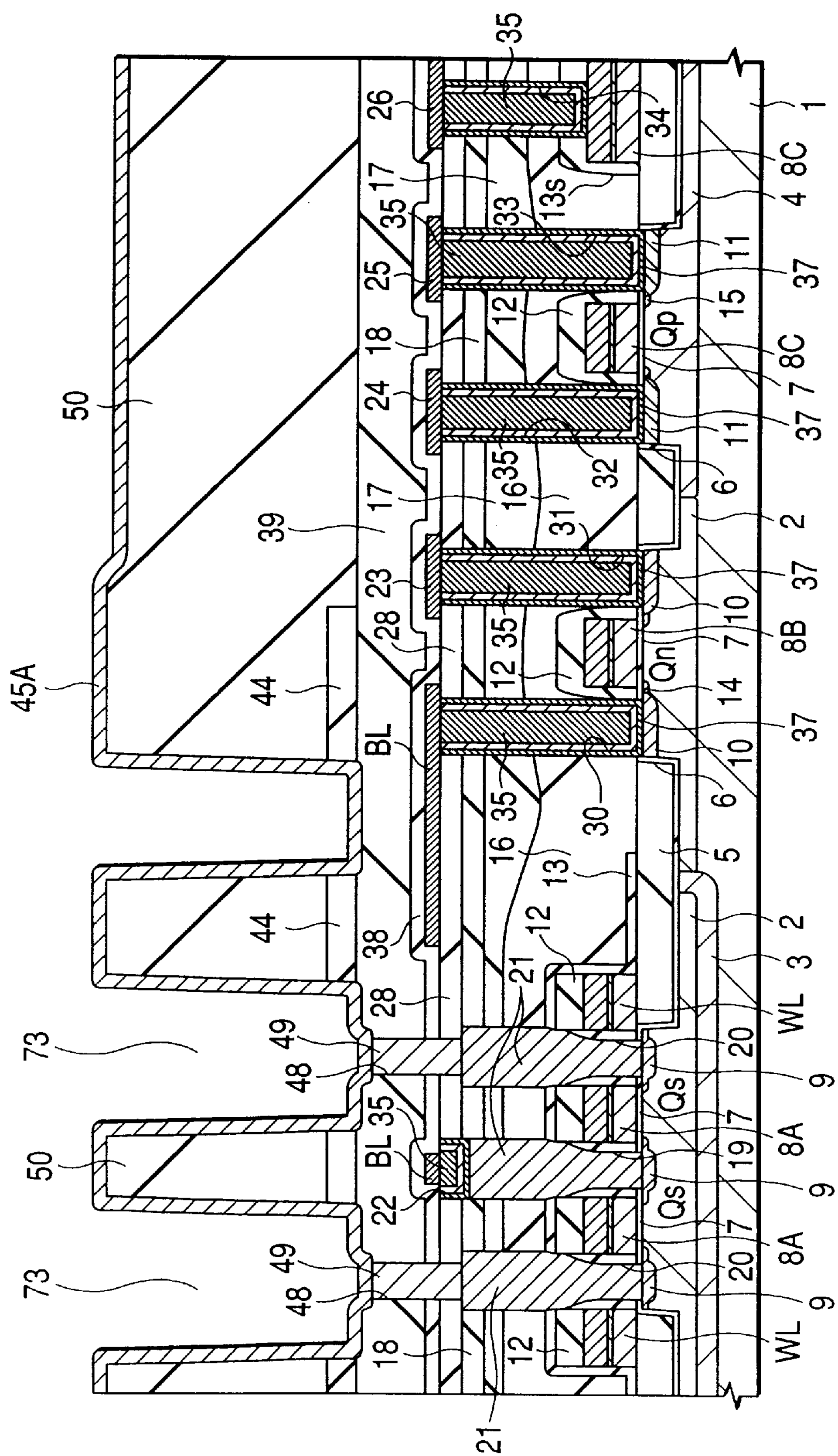

Then, as shown in FIG. 30, an approximately-60-nm-thick polycrystalline silicon film 45A doped with an n-type impurity such as P (phosphorous) is deposited over the silicon oxide film 50 as on well as the interiors of the recesses 73 by a CVD method. This polycrystalline silicon film 45A is used as a lower electrode material for the information storing capacitive elements C.

Figure 31:
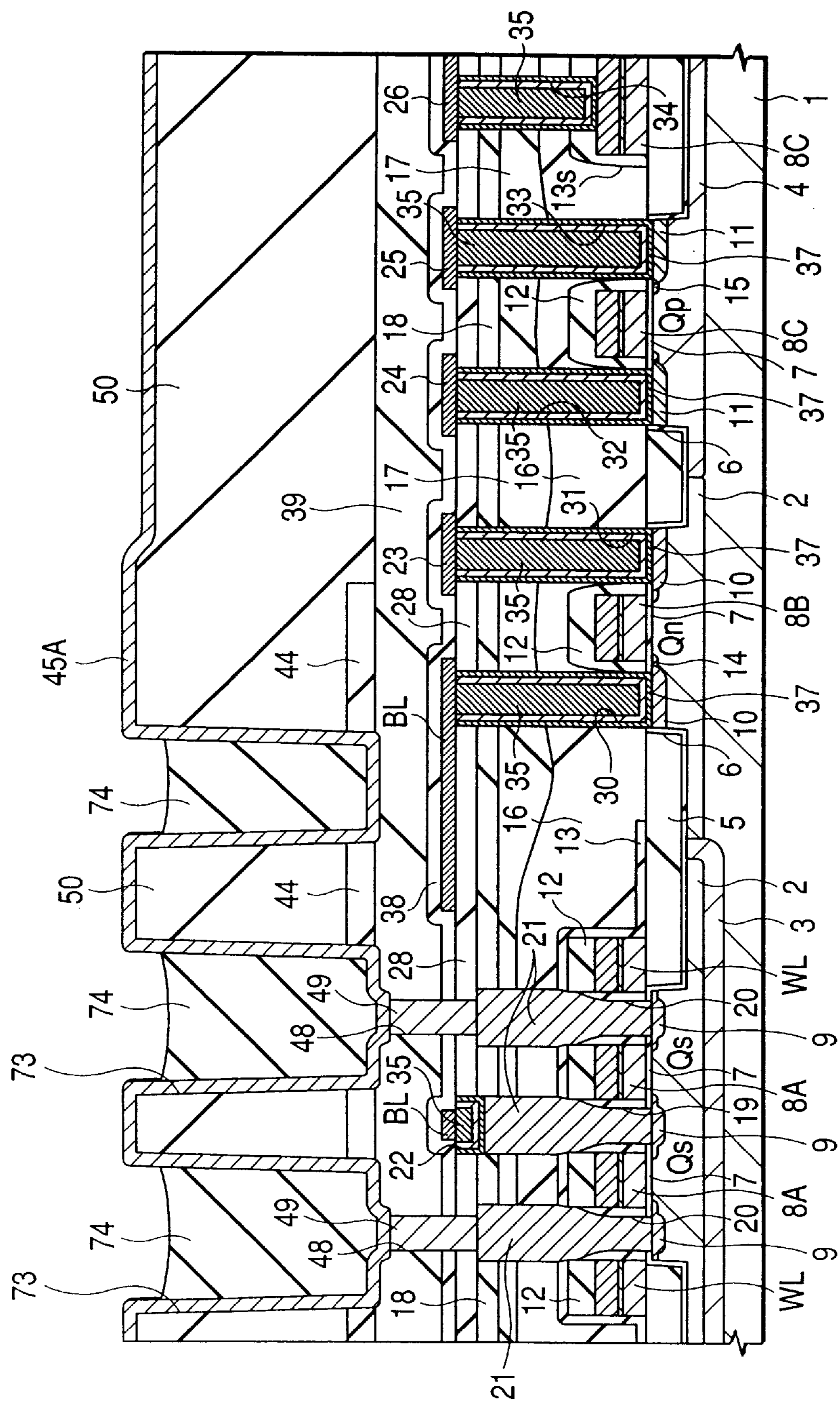

Then, as shown in FIG. 31, an approximately-300-nm-thick SOG film 74 is formed over the polycrystalline silicon film 45A as on well as the interiors of the recesses 73 by spin coating, and after the SOG film 74 is baked by a heat treatment of approximately 400° C., the SOG film 74 outside the recesses 73 is removed by an etch-back process.

Figure 32:
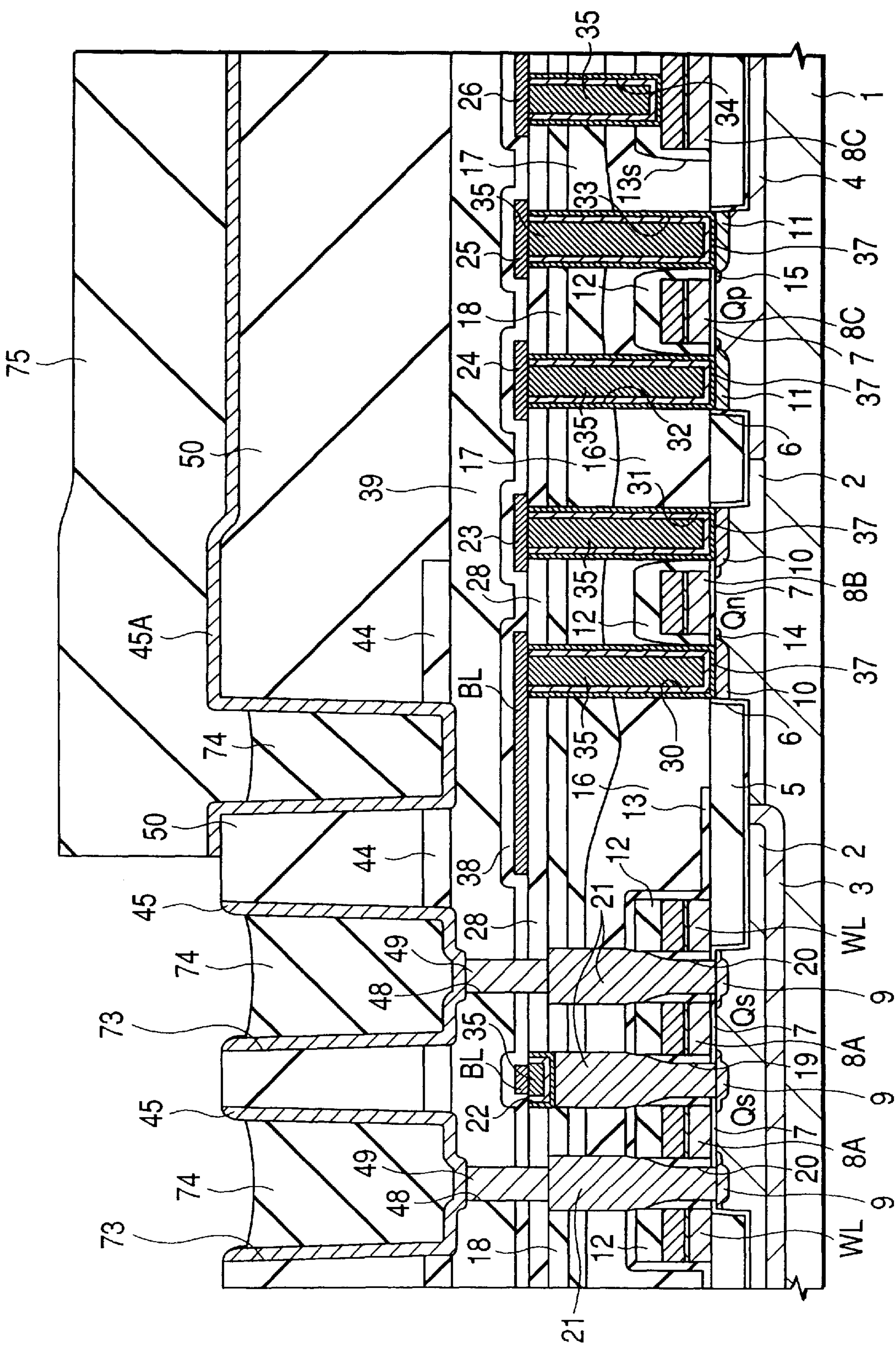

Then, as shown in FIG. 32, the portion of the polycrystalline silicon film 45A which overlies the peripheral circuit is covered with a photoresist film 75 and the portion of the polycrystalline silicon film 45A which overlies the silicon oxide film 50 of the memory array is removed by an etch-back process (anisotropic etching), whereby the lower electrodes 45 are formed along the inner walls of the respective recesses 73. The lower electrodes 45 may also be formed of a conducting film other than the polycrystalline silicon film 45A. It is desirable that the conducting film for the lower electrodes 45A be formed of a conducting material which has a heat resistance and oxidation resistance which are not so weak as to degrade during high-temperature heat treatment of a capacitive insulating film to be performed in the next process step, for example, a high melting-point metal such as W or Ru (ruthenium) or a conducting metal oxide such as RuO (ruthenium oxide) or IrO (iridium oxide).

Figure 33:
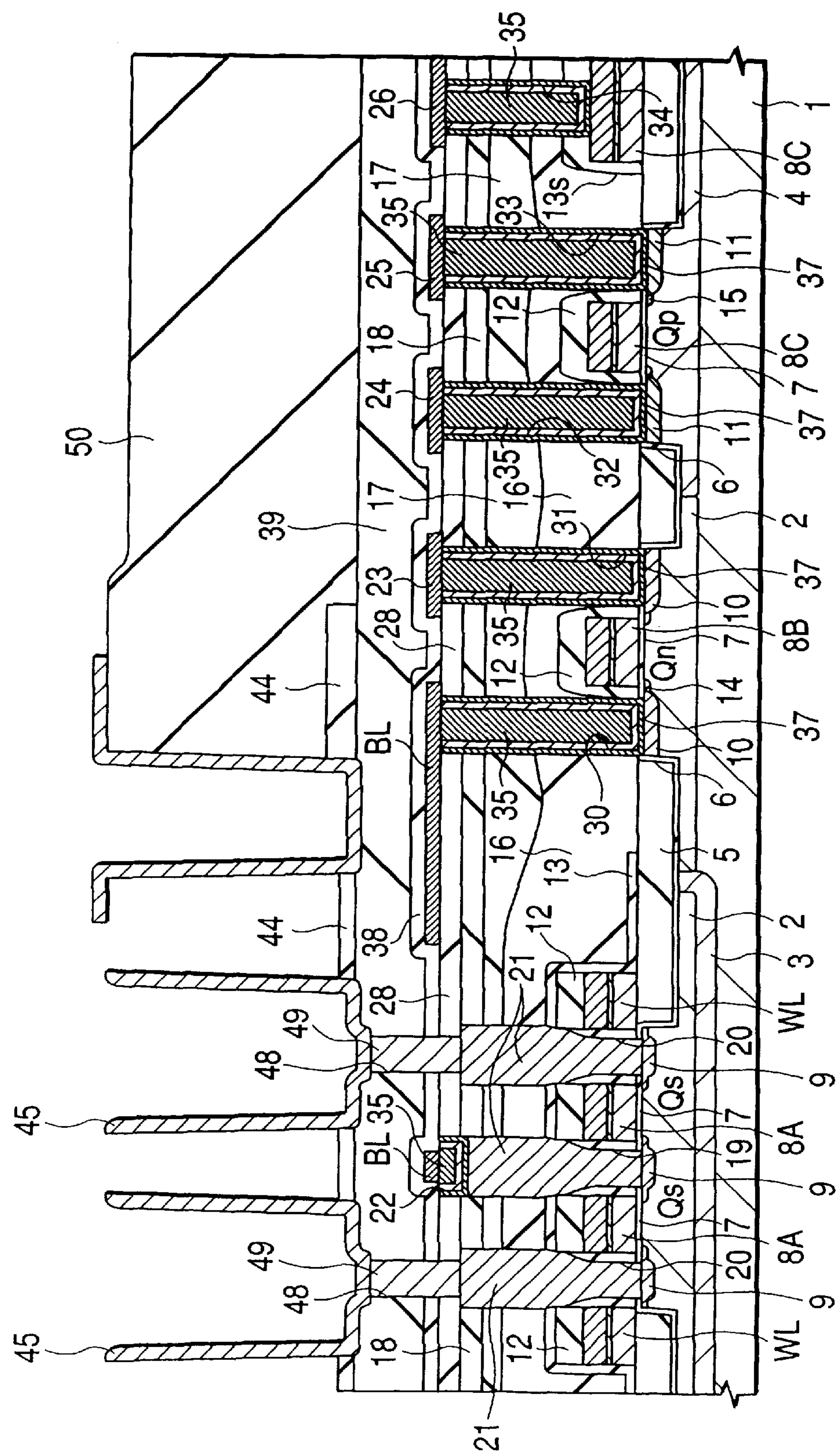

Then, as shown in FIG. 33, after the silicon oxide film 50 which is left between the recesses 73 and the SOG films 74 which are left in the respective recesses 73 are simultaneously removed by a hydrofluoric acid-based etchant, the photoresist film 75 is removed. Then, the polycrystalline silicon film 45A which overlies the peripheral circuit is removed by dry etching using as a mask a photoresist film which covers the memory array, thereby finishing the lower electrodes 45 each having a cylindrical shape. Since the silicon nitride film 44 is formed at the bottom of the silicon oxide film 50 between the recesses 73, the underlying SOG film 39 is not etched during wet etching of the silicon oxide film 50. At this time, since the surface of the peripheral circuit is covered with the polycrystalline silicon film 45A, the underlying thick silicon oxide film 50 is not etched.

By leaving the thick silicon oxide film 50 over the peripheral circuit, the interlayer insulating films 56 and 63 to be formed above the information storing capacitive elements C in a later process step are made approximately equal in height between the memory array and the peripheral circuit. Accordingly, it is possible to facilitate formation of the second-layer interconnect lines 52 and 53 above the interlayer insulating film 56, formation of the third-layer interconnect lines 57 and 58 above the second-layer insulating film 63, and formation of the through-holes 60 and 61 which interconnect the second- and third-layer interconnect lines.

Figure 34:
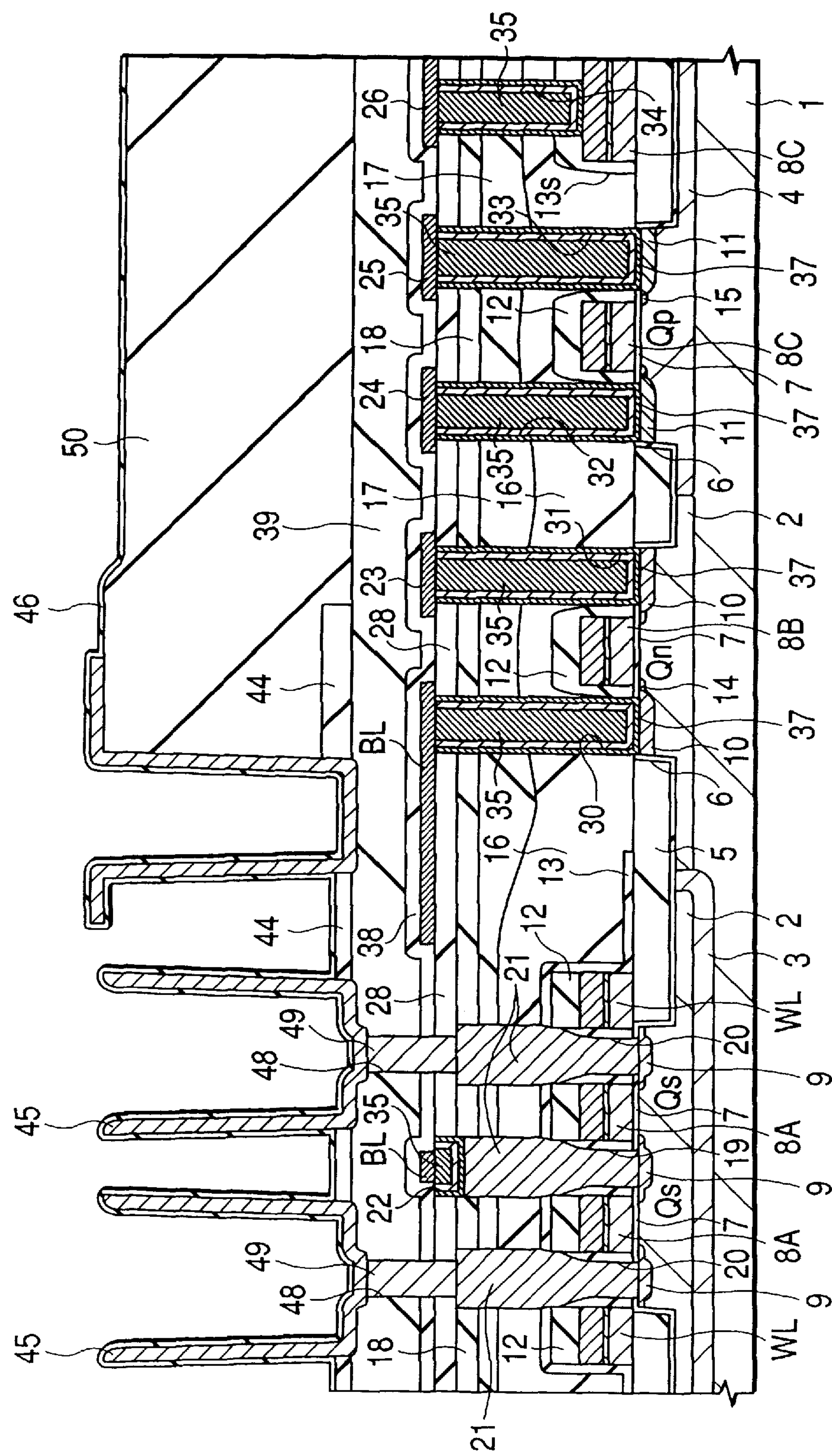

Then, after a thin nitride film (not shown) is formed over the surface of each of the lower electrodes 45 by performing heat treatment at 300° C. for approximately three minutes in an ammonium atmosphere, a thin $Ta_2O_5$ (tantalum oxide) film 46 of approximately 14 nm in thickness is deposited over the lower electrodes 45 as shown in FIG. 34. The nitride film over the surfaces of the lower electrode 45 is formed to prevent a polycrystalline silicon film (45A) which constitutes the lower electrodes 45 from being oxidized by heat treatment to be next performed. The $Ta_2O_5$ film 46 is deposited by a CVD method which uses, for example, a pentaethoxy tantalum ($Ta(OC_2H_5)$) as a source gas. The $Ta_2O_5$ film 46 formed by the CVD method, which is superior in step coverage, is deposited with an approximately uniform thickness over the entire surfaces of the lower electrodes 45 each having a three-dimensional cylindrical shape.

Then, the $Ta_2O_5$ film 46 is heat-treated in an oxidizing atmosphere at 800° C. for approximately three minutes. By performing this high-temperature heat treatment, the crystal defects produced in the $Ta_2O_5$ film 46 are repaired to provide a crystallized good-quality $Ta_2O_5$ film 46. Thus, leakage current from the information storing capacitive elements C can be reduced, whereby DRAMs having improved refresh characteristics can be manufactured.

In addition, since each of the lower electrodes 45 of the information storing capacitive elements C is formed in a three-dimensional cylindrical shape which is increased in its surface area and the capacitive insulating film is formed of the $Ta_2O_5$ film 46 having a dielectric constant of approximately 20–25, it is possible to ensure a charge storage quantity sufficient to hold information even if the memory call is scaled to a far smaller size.

In addition, since the underlying bit lines BL and the first-layer interconnect lines 23 to 26 which are formed prior to the deposition of the $Ta_2O_5$ film 46 are formed of a W film having good adhesion to a silicon oxide-based insulating film, it is possible to reliably prevent a failure in which the bit lines BL and the interconnect lines 23 to 26 cause film peeling due to the high-temperature heat treatment of the $Ta_2O_5$ film 46.

In addition, since the bit lines BL are formed of a W film having a high heat resistance, it is possible to reliably prevent a failure in which the bit lines BL each of which is formed to have a small width not greater than the minimum process dimension are degraded or disconnected due to the high-temperature heat treatment of the $Ta_2O_5$ film 46. Furthermore, since the plugs 35 in the contact holes 30 to 35 which connect the MISFETs of the peripheral circuit and the first-layer interconnect lines 23 to 26 are formed of a highly heat-resistant conducting material (W film/TiN film/Ti film), it is possible to prevent the problem that leakage current from a source or drain increases or contact resistance increases due to the high-temperature heat treatment of the $Ta_2O_5$ film 46.

The capacitive insulating film of the information storing capacitive elements C may be formed of a high dielectric (ferro-dielectric) film made of a metal oxide such as BST, STO, $BaTiO_3$ (barium titanate), $PbTiO_3$ (lead titanate), PZT ($PbZr_XTi_{1-X}O_3$), PLT ($PbLa_XTi_{1-X}O_3$) or PLZT. These high dielectric (ferro-dielectric) films have a common nature which needs high-temperature heat treatment of at least 750° C. or more after they are formed, so that high-quality film having less crystal defects can be obtained. Accordingly, even if these high dielectric (ferro-dielectric) films are used, it is possible to obtain an effect similar to the above-described one.

Figure 35:
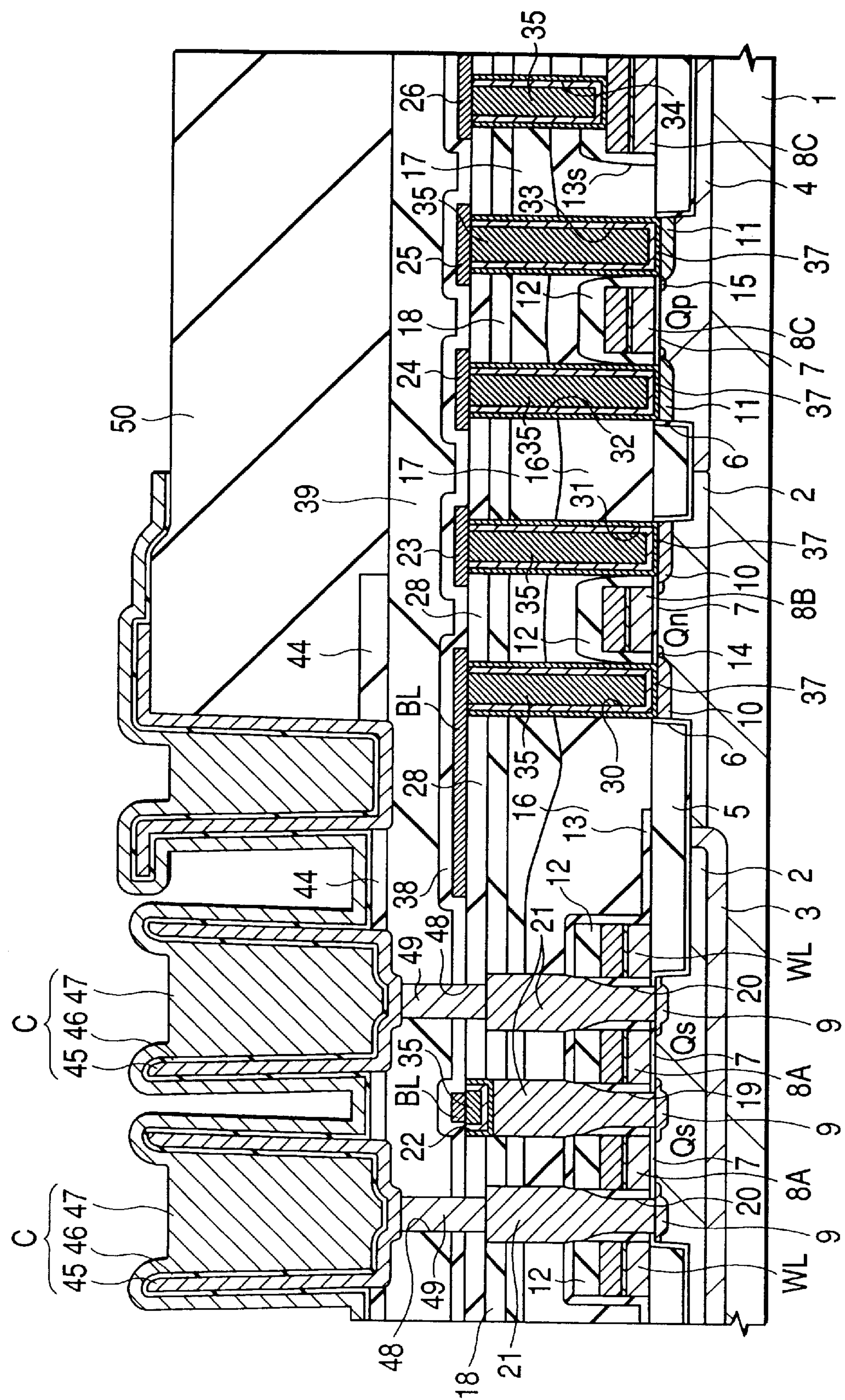

Then, as shown in FIG. 35, after a TiN film is deposited over the $Ta_2O_5$ film 46 by using a CVD method and a sputtering method, the TiN film and the $Ta_2O_5$ film 46 are patterned by dry etching using a photoresist film as a mask, thereby finishing the information storing capacitive elements C each of which is formed of the upper electrode 47 made of the TiN film, a capacitive insulating film made of the $Ta_2O_5$ film 46, and the lower electrode 45 made of a polycrystalline silicon film (45A). Through the above-described process steps, the memory cell is finished which includes the memory cell selecting MISFETs Qs and the information storing capacitive elements C connected in series with the MISFETs Qs. The upper electrodes 47 of the information storing capacitive elements C may also be formed of a conducting film other than the TiN film, for example, a W film.

Figure 36:
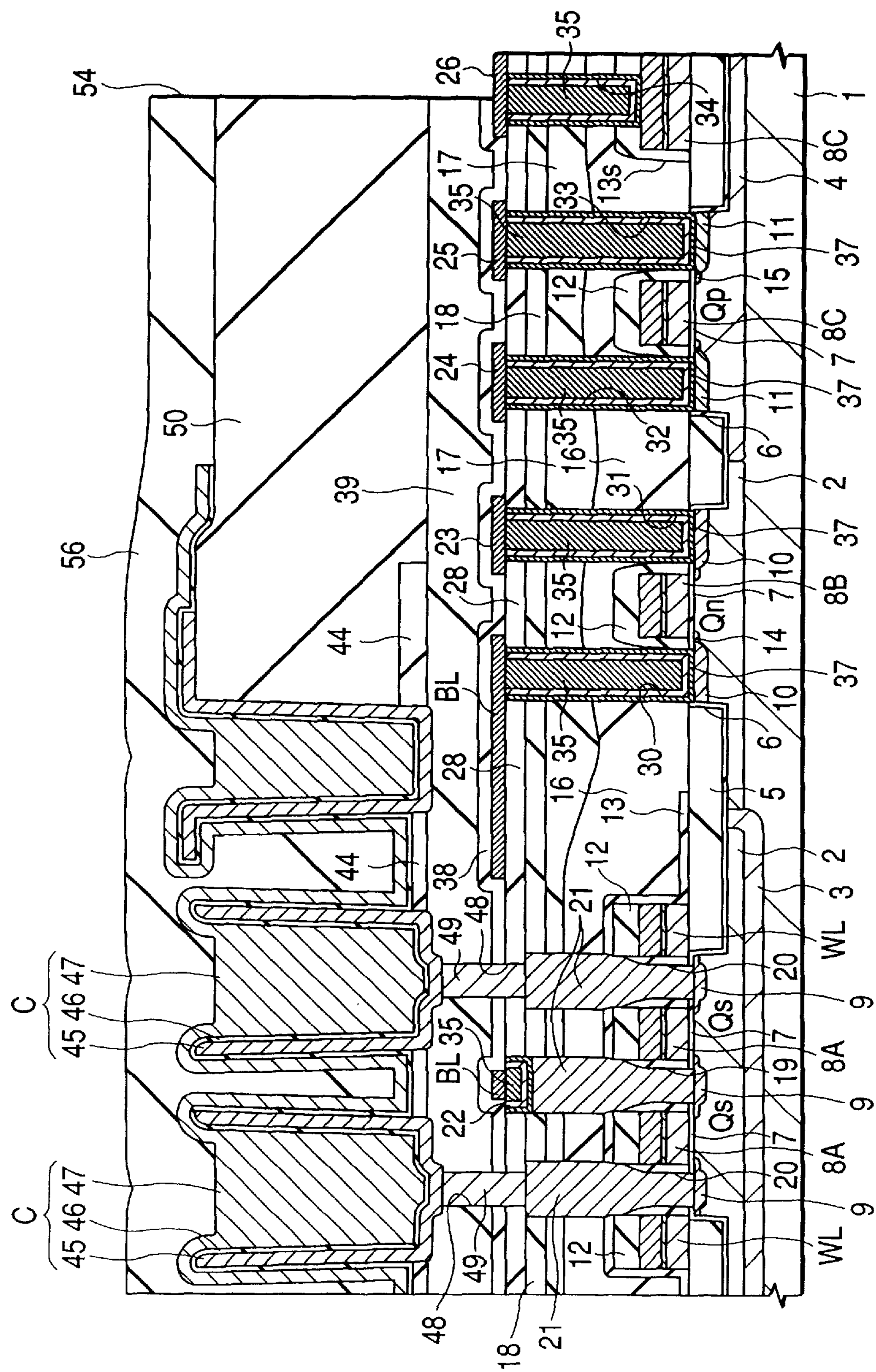

Then, as shown in FIG. 36, after the interlayer insulating film 56 is formed above the information storing capacitive elements C, the through-hole 54 is formed above the first-layer interconnect line 26 by etching the interlayer insulating film 56, the silicon oxide film 50, the SOG film 39 and the silicon oxide film 38 of the peripheral circuit using a photoresist film as a mask. The interlayer insulating film 56 is formed of, for example, an approximately-600-nm-thick silicon oxide film deposited by a CVD method.

Figure 37:
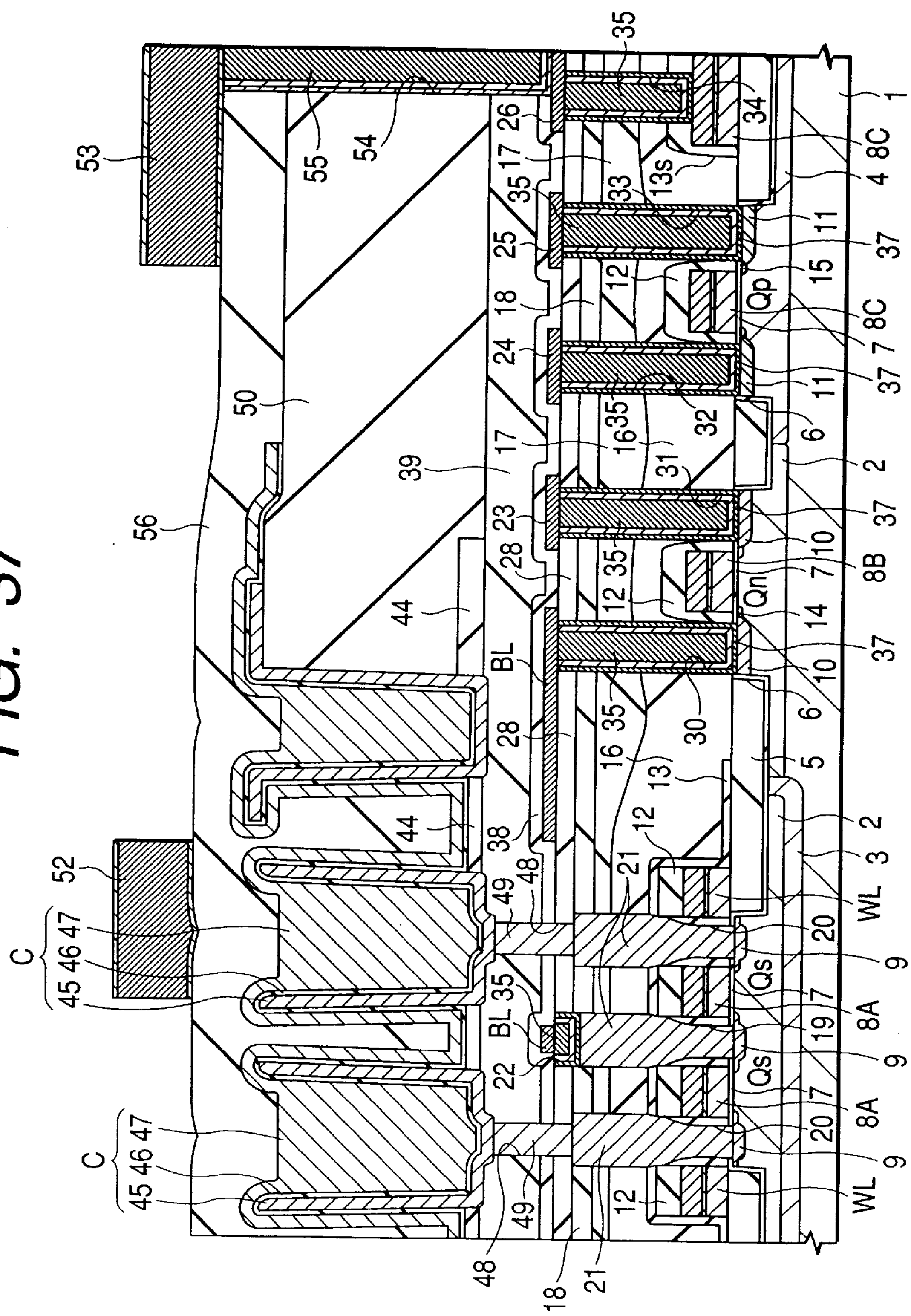

Then, as shown in FIG. 37, after the plug 55 is formed in the through-hole 54, the second-layer interconnect lines 52 and 53 are formed above the interlayer insulating film 56. The plug 55 is formed by depositing, for example, a Ti film on the interlayer insulating film 56, depositing a TiN film and a W film over the Ti film by a CVD method, and etching back (dry-etching) these films to leave them in only the through-hole 54. The second-layer interconnect lines 52 and 53 are formed by depositing an approximately-50-nm-thick Ti film, an approximately-500-nm-thick Al (aluminum) film, an approximately-50-nm-thick Ti film and an approximately-50-nm-thick TiN film over the interlayer insulating film 56 in that order by a CVD method, and patterning these films by dry etching using a photoresist film as a mask.

Since a process step which is accompanied by high-temperature heat treatment is not needed after the capacitive insulating film for the information storing capacitive elements C is formed, a conducting material mainly made of Al which is inferior in heat resistance but low in electrical resistance as compared with a high melting-point metal or a nitride thereof can be used as the material of the second-layer interconnect lines 52 and 53 which are formed above the interlayer insulating film 56. In addition, since no process step accompanied by high-temperature heat treatment is needed and the problem of film peeling does not occur, when the second-layer interconnect lines 52 and 53 are to be formed above the interlayer insulating film 56 formed of silicon oxide, a Ti film can be used as a barrier metal at the interfacial portion between each of the second-layer interconnect lines 52 and 53 and the interlayer insulating film 56 to be brought into contact with each of them.

Figure 38:
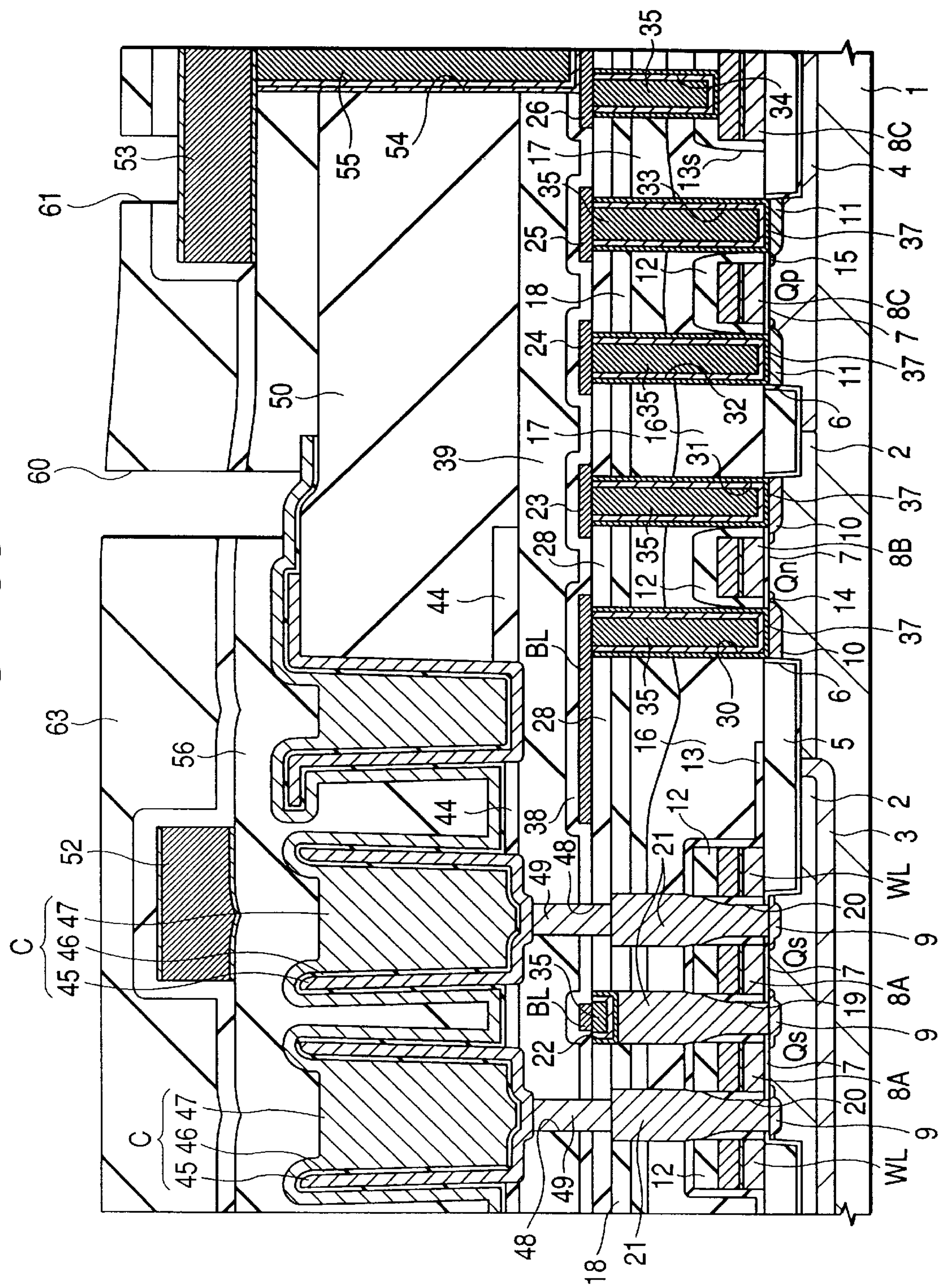

Then, as shown in FIG. 38, after the second-layer insulating film 63 is formed above the second-layer interconnect lines 52 and 53, the portions of the interlayer insulating films 63 and 56 which overlie the information storing capacitive elements C are etched to form the through-hole 60, and the portion of the interlayer insulating film 63 which overlies the second-layer interconnect line 53 of the peripheral circuit is etched to form the through-hole 61. The second-layer insulating film 63 is formed of an approximately-300-nm-thick silicon oxide film deposited by, for example, a CVD method, an approximately-400-nm-thick silicon oxide film formed over the silicon oxide film by spin coating, and an approximately-300-nm-thick silicon oxide film deposited over the approximately-400-nm-thick silicon oxide film by a CVD method. The baking of the SOG film which constitutes part of the second-layer insulating film 63 is performed at a temperature of approximately 400° C. to prevent degradation of the second-layer interconnect lines 52 and 53 mainly made of Al and degradation of the capacitive insulating film of the information storing capacitive elements C.

After that, the plugs 62 are formed in the respective through-holes 60 and 61 and the third-layer interconnect lines 57, 58 and 59 are then formed above the interlayer insulating film, whereby the DRAM shown in FIG. 3 is nearly finished. The plugs 62 are formed of, for example, a conducting material (W film/TiN film/Ti film) identical to that of the plug 55, and the third-layer interconnect lines 57, 58 and 59 are formed of, for example, a conducting material (TiN film/Ti film/Al film/Ti film) identical to that of the second-layer interconnect lines 52 and 53. Incidentally, a dense insulating film having high waterproof properties (for example, a two-layer insulating film made of a silicon oxide film and a silicon nitride film which are deposited by a plasma-CVD method) is deposited over the third-layer interconnect lines 57, 58 and 59, but the illustration of such insulating film is omitted for clarity.

Although the invention made by the present inventors has been specifically described with reference to an embodiment of the present invention, the present invention is not limited to the above-described embodiment and various modifications can of course be made without departing from the spirit and scope of the present invention.

The present invention can also be applied to a semiconductor integrated circuit device or the like in which a DRAM, a logic LSI and a flash memory are arranged on a single semiconductor chip.

Effects which can be obtained from representative features of the present invention disclosed herein will be described in brief below.

According to the present invention, in a DRAM having a capacitor-over-bitline structure in which the capacitive insulating film of information storing capacitive elements is formed of a high dielectric material, the portions of bit lines and interconnect lines of a peripheral circuit which are in contact with at least an underlying silicon oxide film are formed of a high melting-point metal film other than titanium or cobalt, the bit lines and the interconnect lines being arranged below the information storing capacitive elements, whereby the adhesion between the bit lines and the interconnect lines of the peripheral circuit and the silicon oxide film is improved and it is possible to reliably prevent a failure in which peeling occurs at the interface between the bit lines or the interconnect lines of the peripheral circuit and the silicon oxide film during high-temperature heat treatment to be performed when the capacitive insulating film is being formed. Accordingly, it is possible to improve the reliability and the manufacture yield of 256-Mbit large-capacity DRAMs and later-generation DRAMs.

Incidentally, Japanese Patent Laid-Open No. 92794/1997 has been discovered through a search for a known example relative to “plug electrode made of Ti/TiN/W” which is one constituent element of the present invention.

Although “plug electrodes made of Ti/TiN/W” are described in the above-identified specification, bit lines and interconnect lines for a peripheral circuit all of which are formed in the same layer are made of Ti/TiN/W. Accordingly, peeling occurs at the interface between the bit lines and an underlying oxide film.

It is apparent, therefore, that Japanese Patent Laid-Open No. 92794/1997 does not at all take into account the problem of peeling and utterly differs from the present invention.

What is claimed is:

1. A semiconductor integrated circuit device in which an interconnect line which extends with at least a portion of said interconnect line being in contact with a silicon oxide-based first insulating film is formed over said first insulating film which is formed over a principal surface of a semiconductor substrate, and a capacitive element having a capacitive insulating film at least a portion of which is formed of a high dielectric film is formed over a second insulating film formed over said interconnect line, wherein a portion of a conducting film which constitutes said interconnect line, which portion is in contact with said first insulating film over said first insulating film, is formed of a high melting-point metal excluding titanium or a nitride of a high melting-point metal.

2. A semiconductor integrated circuit device comprising a DRAM in which a memory cell selecting MISFET provided with a gate electrode formed integrally with a word line is formed in a first area over a principal surface of a semiconductor substrate, a bit line is formed over a silicon oxide-based first insulating film which covers said memory cell selecting MISFET, said bit line being electrically connected to either one of a source and a drain of said memory cell selecting MISFET and extending in contact with said first insulating film, and an information storing capacitive element is formed over a second insulating film formed over said bit line, said information storing capacitive element being electrically connected to the other of said source and drain of said memory cell selecting MISFET and having a capacitive insulating film at least a portion of which is formed of a high dielectric film, wherein a portion of a conducting film which constitutes said bit line, which portion is in contact with said first insulating film over said first insulating film, is formed of a high melting-point metal excluding titanium or a nitride of a high melting-point metal.

3. A semiconductor integrated circuit device according to claim 2, wherein said high dielectric film is a tantalum oxide film which is subjected to heat treatment for crystallization.

4. A semiconductor integrated circuit device according to claim 2, wherein a conducting film which constitutes a gate electrode of said memory cell selecting MISFET is at least partly formed of a metal film.

5. A semiconductor integrated circuit device according to claim 2, wherein a MISFET of a peripheral circuit of said DRAM is formed in a second area over the principal area of said semiconductor substrate, a first-layer interconnect line is formed over said silicon oxide-based first insulating film which covers said MISFET of said peripheral circuit, said first-layer interconnect line being electrically connected to any one of a gate electrode, a source and a drain of said MISFET of said peripheral circuit and extending in contact with said first insulating film, wherein a portion of a conducting film which constitutes said first-layer interconnect line, which portion is in contact with said first insulating film over said first insulating film, is formed of a high melting-point metal excluding titanium or a nitride of a high melting-point metal.

6. A semiconductor integrated circuit device according to claim 5, wherein a titanium silicide layer is formed at a bottom of a contact hole which is opened in said first insulating film and electrically connects said first-layer interconnect line and said source or drain of said MISFET of said peripheral circuit.

7. A semiconductor integrated circuit device according to claim 5, wherein each of said conducting films which respectively constitute said bit line and said first-layer interconnect line is a tungsten film.

8. A semiconductor integrated circuit device according to claim 2, wherein said first-layer interconnect line is electrically connected to said source or drain of said MISFET of said peripheral circuit via a plug which is formed in said contact hole and is formed of a stacked film made of a titanium film and a barrier metal film or a stacked film made of a titanium film, a barrier metal film and a tungsten film.

9. A semiconductor integrated circuit device according to claim 5, wherein said gate electrode of said MISFET of said peripheral circuit is formed of a metal film.

10. A semiconductor integrated circuit device according to claim 5, wherein said first insulating film is a spin-on-glass film or a silicon oxide film deposited by a CVD method.

11. A semiconductor integrated circuit device according to claim 5, wherein a second-layer interconnect line which is electrically connected to said first insulating film is formed over a silicon oxide-based third insulating film formed over said information storing capacitive element, and a portion of a conducting film which constitutes said second-layer interconnect line is a titanium film, said portion being in contact with said first insulating film.

12. A method of manufacturing a semiconductor integrated circuit device, comprising the steps of:

(a) forming a silicon oxide-based first insulating film over a principal surface of a semiconductor substrate and then depositing a conducting film a portion of which is in contact with said first insulating film, over said first insulating film, said portion being made of a high melting-point metal excluding titanium or a nitride of a high melting-point metal including titanium;

(b) patterning said conducting film to form an interconnect line which extends with at least a portion of said interconnect line being in contact with said first insulating film, and then forming a second insulating film over said interconnect line; and (c) forming a capacitive element made of a first electrode, a dielectric film and a second electrode, over said second insulating film, said capacitive-element forming step including heat treatment for improving a film quality of said dielectric film.

13. A method of manufacturing a semiconductor integrated circuit device, comprising the steps of:

(a) forming a memory cell selecting MISFET which constitutes a memory cell of a DRAM, in a first area over a principal surface of a semiconductor substrate, and forming a MISFET which constitutes a peripheral circuit of said DRAM, in a second area over said principal surface of said semiconductor substrate;

(b) forming a silicon oxide-based first insulating film over each of said memory cell selecting MISFET and said MISFET of said peripheral circuit;

(c) forming a first contact hole in said first insulating film over at least one of a source and a drain of said memory cell selecting MISFET, forming second contact holes in said first insulating film over said respective source and drain of said MISFET of said peripheral circuit, and forming a third contact hole in said first insulating film over a gate electrode of said MISFET of said peripheral circuit;

(d) depositing a titanium film over said first insulating film as well as interiors of said respective second and third contact holes, and forming titanium silicide layers over surfaces of a source and a drain of said MISFET of said peripheral circuit which are respectively exposed at bottoms of said second contact holes, by heat-treating said semiconductor substrate;

(e) depositing a barrier metal film or a stacked film made of said barrier metal and a high melting-point metal film excluding titanium over said titanium film as well as interiors of said second and third contact holes and then forming plugs in said respective second and third contact holes by removing said barrier metal film or said stacked film over said first insulating film together with said titanium film;

(f) depositing a conducting film over said first insulating film, at least a portion of said conducting film which is in contact with said first insulating film being made of a high melting-point metal excluding titanium or a nitride of a high melting-point metal;

(g) patterning said conducting film to form a bit line to be electrically connected to one of said source and said drain of said memory cell selecting MISFET through said first contact hole, and forming a first-layer interconnect line of said peripheral circuit to be electrically connected to said MISFET of said peripheral circuit through said second contact holes or said third contact hole; and (h) forming an information storing capacitive element made of a first electrode, a high dielectric film and a second electrode, over said second insulating film, said capacitive-element forming step including heat treatment for improving a film quality of said dielectric film.

14. A method of manufacturing a semiconductor integrated circuit device according to claim 13, wherein a conducting film which constitutes a gate electrode of said memory cell selecting MISFET and a gate electrode of said MISFET of said peripheral circuit is a stacked film made of a low-resistance polycrystalline silicon film doped with an impurity, a barrier metal film and a tungsten film.

15. A method of manufacturing a semiconductor integrated circuit device according to claim 13, wherein said bit line and said first-layer interconnect line of said peripheral circuit are made of a tungsten film.

16. A method of manufacturing a semiconductor integrated circuit device according to claim 13, wherein said dielectric film is made of a metal oxide.

17. A method of manufacturing a semiconductor integrated circuit device according to claim 16, wherein said metal oxide is tantalum oxide.

18. A method of manufacturing a semiconductor integrated circuit device according to claim 13, wherein heat treatment temperature for improving the film quality of said dielectric film is 750° C. or more.

19. A method of manufacturing a semiconductor integrated circuit device, comprising the steps of:

(a) forming a memory cell selecting MISFET which constitutes a memory cell of a DRAM, in a first area over a principal surface of a semiconductor substrate, and forming a MISFET which constitutes a peripheral circuit of said DRAM, in a second area over said principal surface of said semiconductor substrate;

(b) forming a silicon oxide-based first insulating film over each of said memory cell selecting MISFET and said MISFET of said peripheral circuit;

(c) forming a first contact hole in said first insulating film over at least one of a source and a drain of said memory cell selecting MISFET, forming second contact holes in said first insulating film over said respective source and drain of said MISFET of said peripheral circuit, and forming a third contact hole in said first insulating film over a gate electrode of said MISFET of said peripheral circuit;

(d) depositing a cobalt film over said first insulating film as well as interiors of said respective second and third contact holes, and forming cobalt silicide layers over surfaces of a source and a drain of said MISFET of said peripheral circuit which are respectively exposed at bottoms of said second contact holes, by heat-treating said semiconductor substrate;

(e) depositing a barrier metal film or a stacked film made of said barrier metal and a high melting-point metal film excluding cobalt over said cobalt film as well as interiors of said second and third contact holes and then forming plugs in said respective second and third contact holes by removing said barrier metal film or said stacked film over said first insulating film together with said cobalt film;

(f) depositing a conducting film over said first insulating film, at least a portion of said conducting film which is in contact with said first insulating film being made of a high melting-point metal excluding cobalt or a nitride of a high melting-point metal;

(g) patterning said conducting film to form a bit line to be electrically connected to one of said source and said drain of said memory cell selecting MISFET through said first contact hole, and forming a first-layer interconnect line of said peripheral circuit to be electrically connected to said MISFET of said peripheral circuit through said second contact holes or said third contact hole; and (h) forming an information storing capacitive element made of a first electrode, a high dielectric film and a second electrode, over said second insulating film, said capacitive-element forming step including heat treatment for improving a film quality of said dielectric film.

* * * * *